(12) United States Patent
Yoon et al.

(10) Patent No.: US 12,446,398 B2
(45) Date of Patent: Oct. 14, 2025

(54) DISPLAY DEVICE WITH SUBPIXELS HAVING DIVIDED ELECTRODES

(71) Applicant: LG Display Co., Ltd., Seoul (KR)

(72) Inventors: DooHyun Yoon, Paju-si (KR); Hyeseon Eom, Paju-si (KR); Hyoung-Su Kim, Paju-si (KR); MoonSoo Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 615 days.

(21) Appl. No.: 17/560,123

(22) Filed: Dec. 22, 2021

(65) Prior Publication Data
US 2022/0208887 A1 Jun. 30, 2022

(30) Foreign Application Priority Data

Dec. 29, 2020 (KR) .................. 10-2020-0186419

(51) Int. Cl.
H10K 59/121 (2023.01)
H10K 50/818 (2023.01)
H10K 50/828 (2023.01)
H10K 59/122 (2023.01)
H10K 59/131 (2023.01)
(Continued)

(52) U.S. Cl.
CPC ......... H10K 59/121 (2023.02); H10K 50/818 (2023.02); H10K 50/828 (2023.02); H10K 59/122 (2023.02); H10K 59/131 (2023.02); H10K 59/353 (2023.02);
(Continued)

(58) Field of Classification Search
CPC ............... H10K 59/353; H10K 59/131; H10K 2102/341; H10K 50/805; H01L 33/62; H01L 25/0753; H01L 33/36–387; H01L 33/08
See application file for complete search history.

(56) References Cited

U.S. PATENT DOCUMENTS 11,910,696 B2 * 2/2024 Miyajima ............... H10K 71/00
2011/0175885 A1 * 7/2011 Shirouzu ................ G09G 3/006
345/211
(Continued)

FOREIGN PATENT DOCUMENTS

KR 20060026243 A 3/2006
KR 20120114533 A 10/2012
(Continued)

Primary Examiner — Chad M Dicke
Assistant Examiner — Jeremy Daniel Watts
(74) Attorney, Agent, or Firm — Seed Intellectual Property Law Group LLP

(57) ABSTRACT

A display device may reduce or minimize a size of a light emission area that becomes a dark spot due to particles. The display device includes a substrate provided with a display area for displaying an image by subpixels, first electrodes provided in each of the subpixels over the substrate, driving transistors provided between the substrate and the first electrodes and coupled to each of the first electrodes, a light emitting layer provided over the first electrodes, and a second electrode provided over the light emitting layer. Each of the first electrodes includes divided electrodes spaced apart from each other, a transistor contact portion coupled with the driving transistor through a contact hole, and connection electrodes coupling each of the plurality of divided electrodes with the transistor contact portion.

27 Claims, 11 Drawing Sheets

(51) Int. Cl.
*H10K 59/35* (2023.01)
*H10K 59/80* (2023.01)
*H10K 102/10* (2023.01)

(52) U.S. Cl.
CPC . *H10K 59/80515* (2023.02); *H10K 59/80518* (2023.02); *H10K 59/80524* (2023.02); *H10K 2102/103* (2023.02)

(56) References Cited

U.S. PATENT DOCUMENTS

| | | | |
|---|---|---|---|
| 2015/0060819 A1* | 3/2015 | Sato | H10K 59/1213 257/40 |
| 2015/0188077 A1* | 7/2015 | Kim | H10K 59/80522 438/46 |
| 2020/0185475 A1* | 6/2020 | Kim | H10K 59/131 |
| 2021/0193952 A1* | 6/2021 | Shim | H10K 59/84 |
| 2022/0052242 A1* | 2/2022 | Ikeda | H10H 20/831 |
| 2022/0059610 A1* | 2/2022 | Lin | H01L 25/0753 |
| 2022/0393086 A1* | 12/2022 | Tae | H01L 25/0753 |
| 2023/0033767 A1* | 2/2023 | Yang | H01L 27/156 |
| 2023/0057723 A1* | 2/2023 | Li | H01L 21/768 |

FOREIGN PATENT DOCUMENTS

| | | |
|---|---|---|
| KR | 20160082768 A | 7/2016 |
| KR | 20170038602 A | 4/2017 |

\* cited by examiner

DISPLAY DEVICE WITH SUBPIXELS HAVING DIVIDED ELECTRODES

BACKGROUND

Technical Field

The present disclosure relates to a display device.

Description of the Related Art

A display device may include a first electrode, a light emitting layer, and a second electrode, which are sequentially deposited, and may emit light through the light emitting layer when a voltage is applied to the first electrode and the second electrode. In this display device, particles may occur on the first electrode during a manufacturing process, and in this case, a short may occur between the first electrode and the second electrode in the area where the particles occur. For this reason, the display device has a problem in that all of subpixels in which particles occur become dark spots so as not to emit light.

Recently, studies for a transparent display device in which a user may view objects or images positioned at an opposite side by transmitting the display device are actively ongoing. The transparent display device includes a display area on which an image is displayed, and a non-display area, wherein the display area may include a transmissive area capable of transmitting external light, and a non-transmissive area. The transparent display device may have high light transmittance in the display area through the transmissive area.

The transparent display device has a small sized light emission area due to the transmissive area as compared with a general display device. Therefore, when entire subpixels become dark spots due to particles, luminance deterioration may occur in the transparent display device more remarkably than the general display device.

BRIEF SUMMARY

The present disclosure has been made in view of various technical problems including the above problems, and various embodiments of the present disclosure provide a display device that may reduce or minimize a size of a light emission area that becomes a dark spot.

In addition to the technical benefits of the present disclosure as mentioned above, additional technical benefits and features of the present disclosure will be clearly understood by those skilled in the art from the following description of the present disclosure.

In accordance with an embodiment of the present disclosure, the above and other technical benefits can be accomplished by the provision of a display device comprising a substrate, a plurality of first electrodes, a plurality of driving transistors, a light emitting layer, and a second electrode. The substrate is provided with a display area for displaying an image by a plurality of subpixels. The plurality of first electrodes is provided in each of the plurality of subpixels. The plurality of first electrodes is over the substrate. The plurality of driving transistors is provided between the substrate and the plurality of first electrodes. Each of the plurality of driving transistors is coupled to a respective first electrode of the plurality of first electrodes. The light emitting layer is provided over the plurality of first electrodes. The second electrode is provided over the light emitting layer. Each of the plurality of first electrodes includes a plurality of divided electrodes spaced apart from each other, a transistor contact portion coupled with the driving transistor through a contact hole, and a plurality of connection electrodes connecting each of the plurality of divided electrodes with the transistor contact portion.

In accordance with another embodiment of the present disclosure, the above and other technical benefits can be accomplished by the provision of a display device comprising a substrate provided with transmissive areas and a non-transmissive area disposed between the transmissive areas, a driving transistor provided in the non-transmissive area over the substrate, and a first electrode provided over the driving transistor. The first electrode includes a plurality of divided electrodes and a plurality of connection electrodes configured to couple each of the plurality of divided electrodes to the driving transistor. A light emitting layer is provided over the first electrode, and a second electrode is provided over the light emitting layer. The plurality of divided electrodes and the plurality of connection electrodes include a first electrode layer and a second electrode layer provided over the first electrode layer. At least a portion of the plurality of connection electrodes includes a high resistance area in which the first electrode layer, the second electrode layer or both is or are discontinuous.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
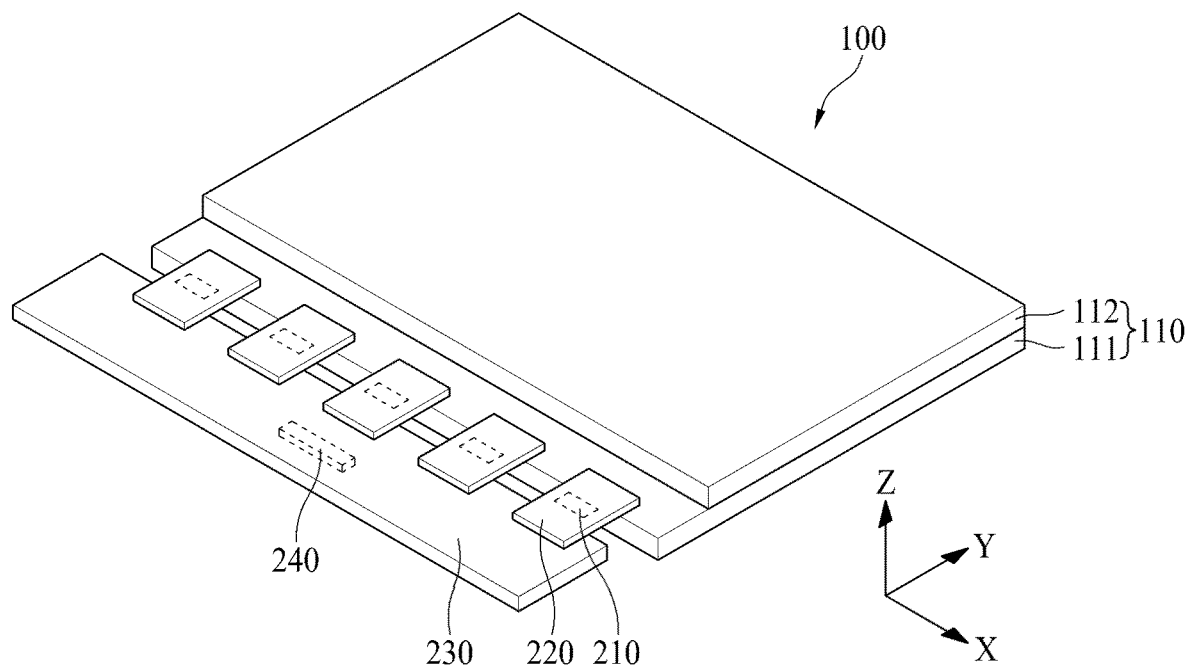
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the technical features of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless otherwise mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a display device according to the present disclosure will be described in detail with reference to the accompanying drawings. Wherever possible, the same reference numbers will be used throughout the drawings to refer to the same or like parts.

FIG. 1 is a perspective view illustrating a display device according to one embodiment of the present disclosure.

Hereinafter, X axis indicates a line parallel with a scan line, Y axis indicates a line parallel with a data line, and Z axis indicates a height direction of a display device 100.

Although a description has been described based on that the display device 100 according to one embodiment of the present disclosure is embodied as an organic light emitting display device, the display device 100 may be embodied as a liquid crystal display device, a plasma display panel (PDP), a Quantum dot Light Emitting Display (QLED) or an Electrophoresis display device.

Referring to FIG. 1, the display device 100 according to one embodiment of the present disclosure includes a display panel 110, a source drive integrated circuit (IC) 210, a flexible film 220, a circuit board 230, and a timing controller 240.

The display panel 110 includes a first substrate 111 and a second substrate 112, which face each other. The second substrate 112 may be an encapsulation substrate.

The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the display panel 110, or the non-display area of both peripheral sides of the display panel 110 by a gate driver in panel (GIP) method. In another way, the scan driver may be manufactured in a driving chip, may be mounted on the flexible film, and may be attached to one peripheral side or both peripheral sides of the display area of the display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
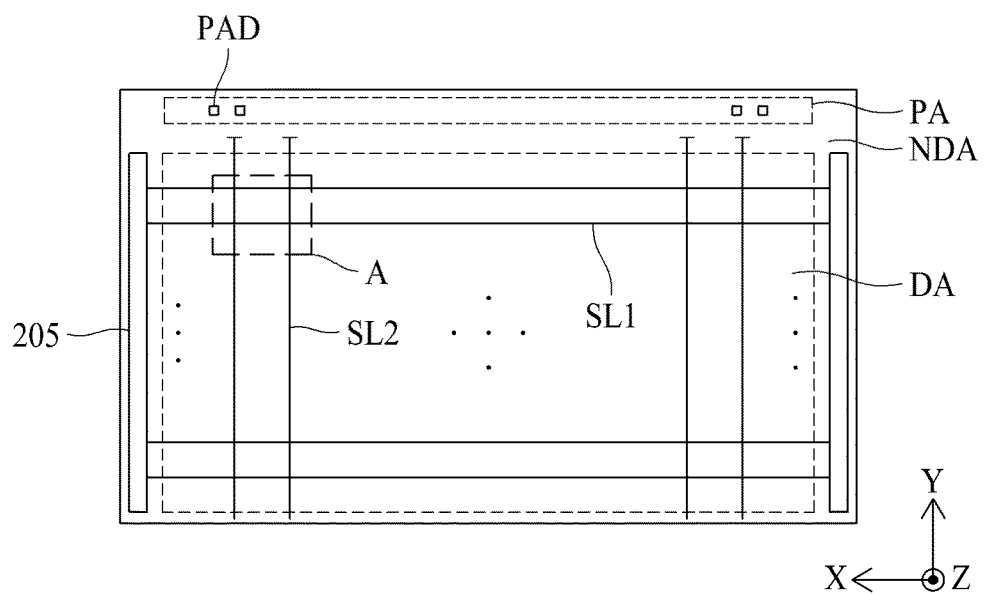
FIG. 2 is a schematic plane view illustrating a display panel according to one embodiment of the present disclosure.
Figure 3:
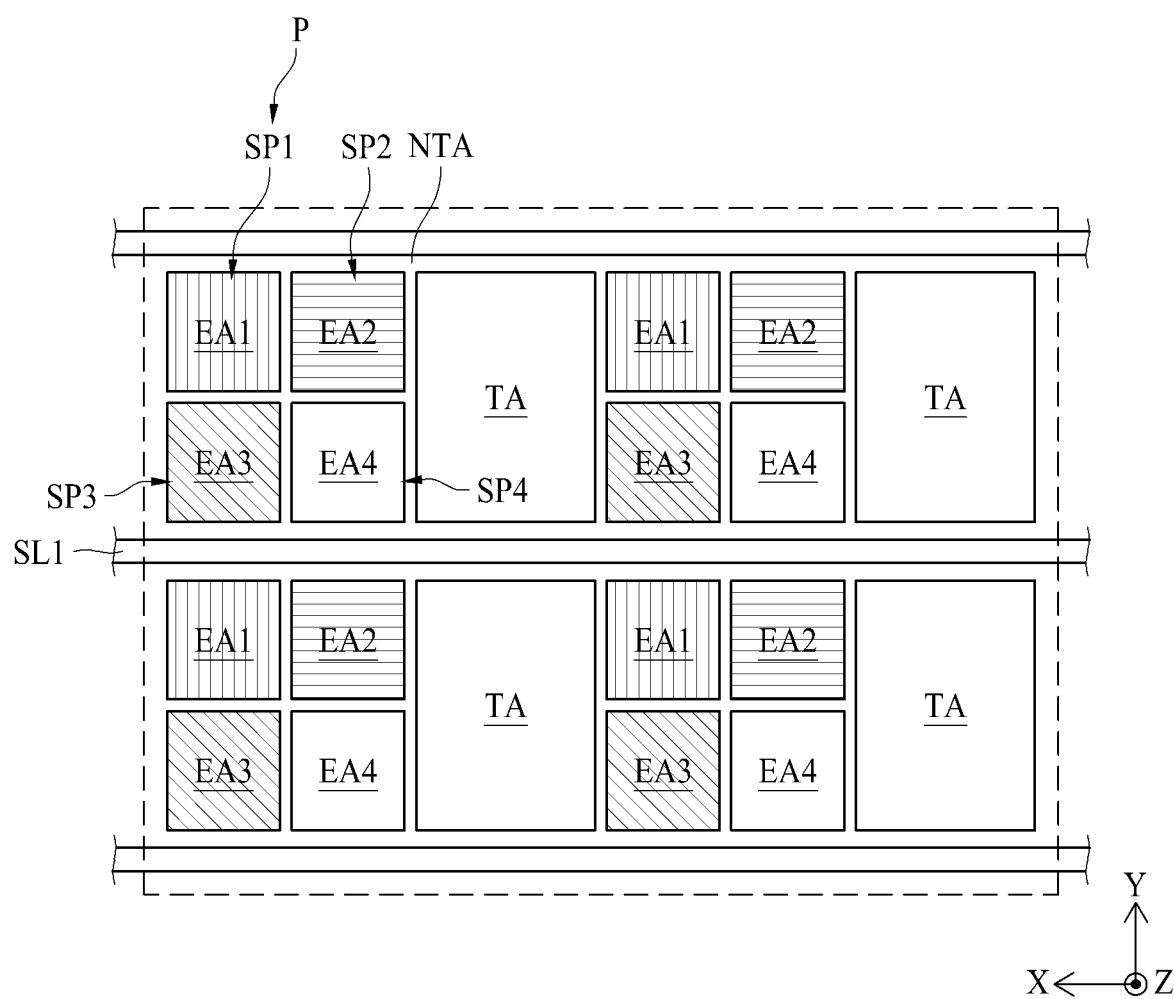
FIG. 3 is a view illustrating an example of a pixel provided in a display panel.
Figure 4:
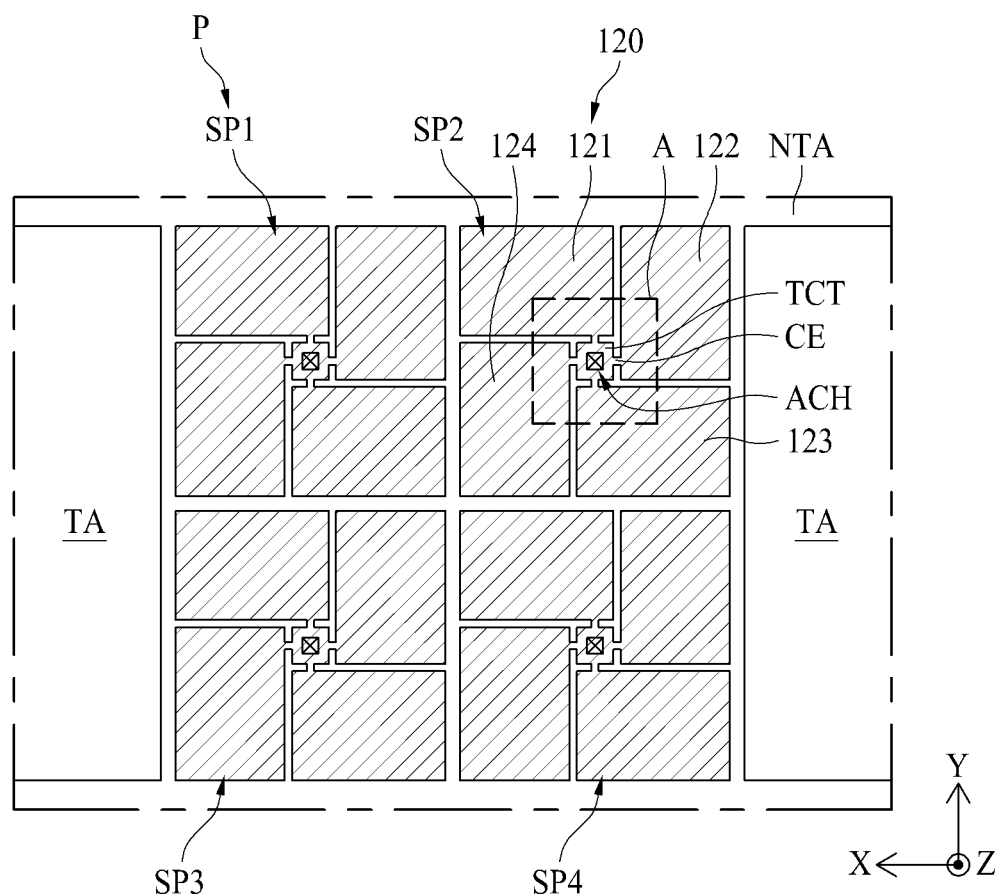
FIG. 4 is a view illustrating an example of a first electrode provided in the pixel shown in FIG. 3.
Figure 5:
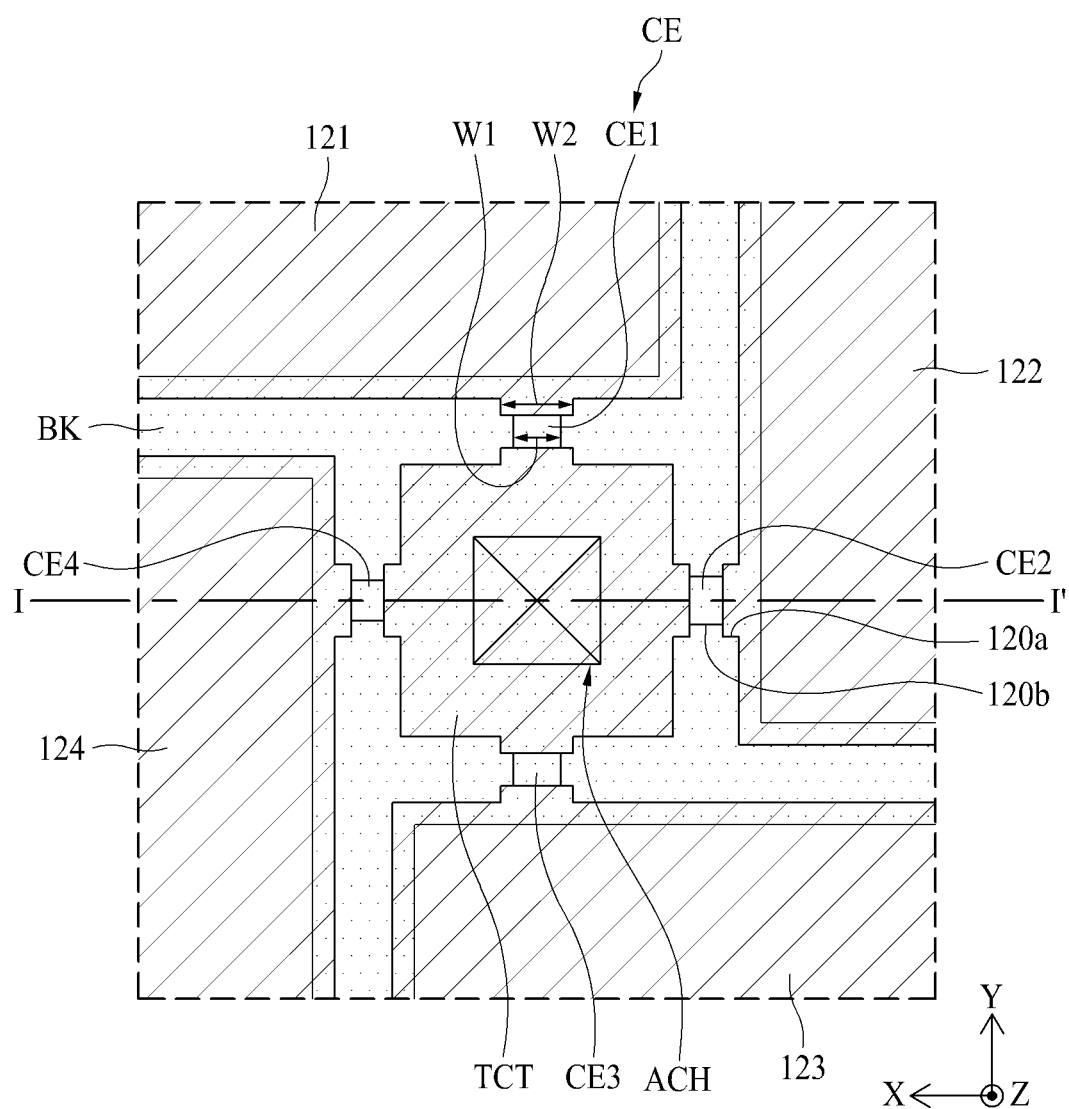
FIG. 5 is an enlarged view illustrating an area A of FIG. 4.
Figure 6:
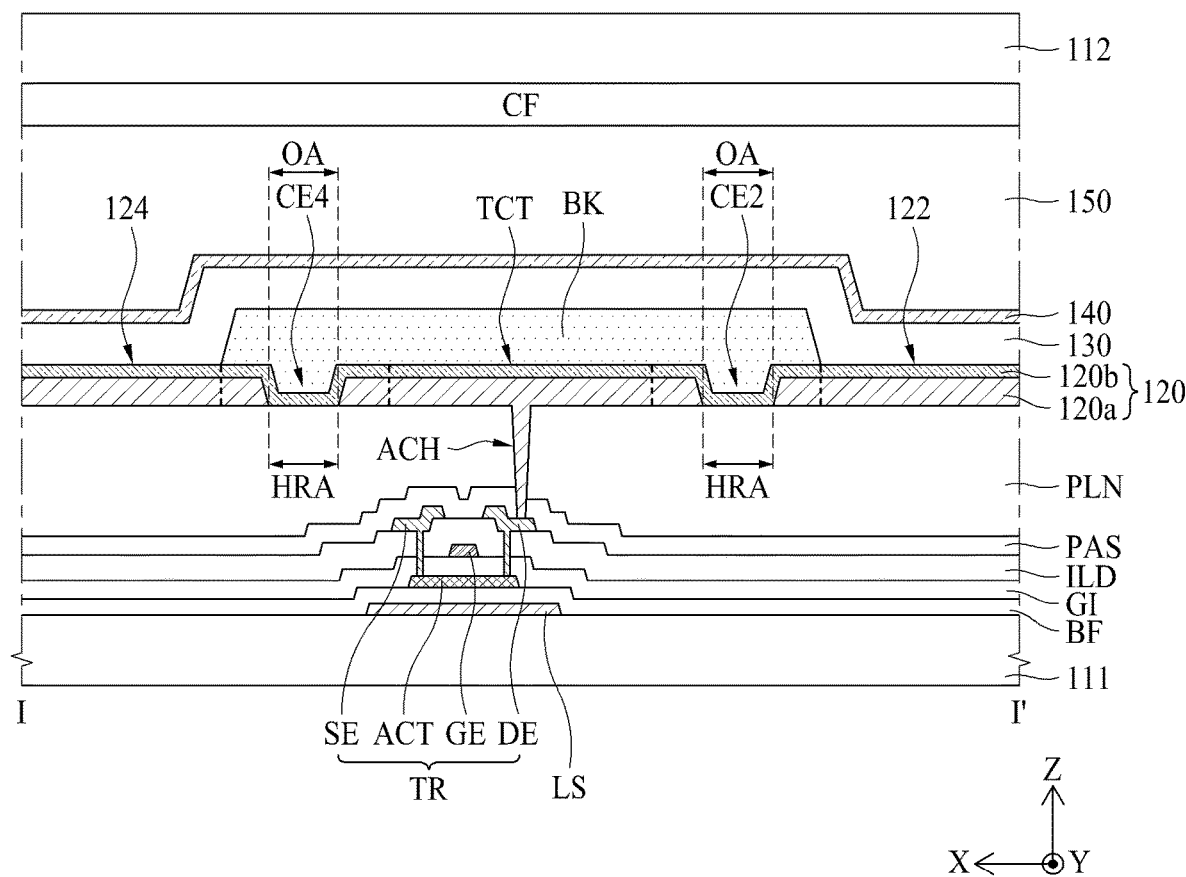
FIG. 6 is a cross-sectional view taken along line I-I' of FIG. 5.
Figure 7:
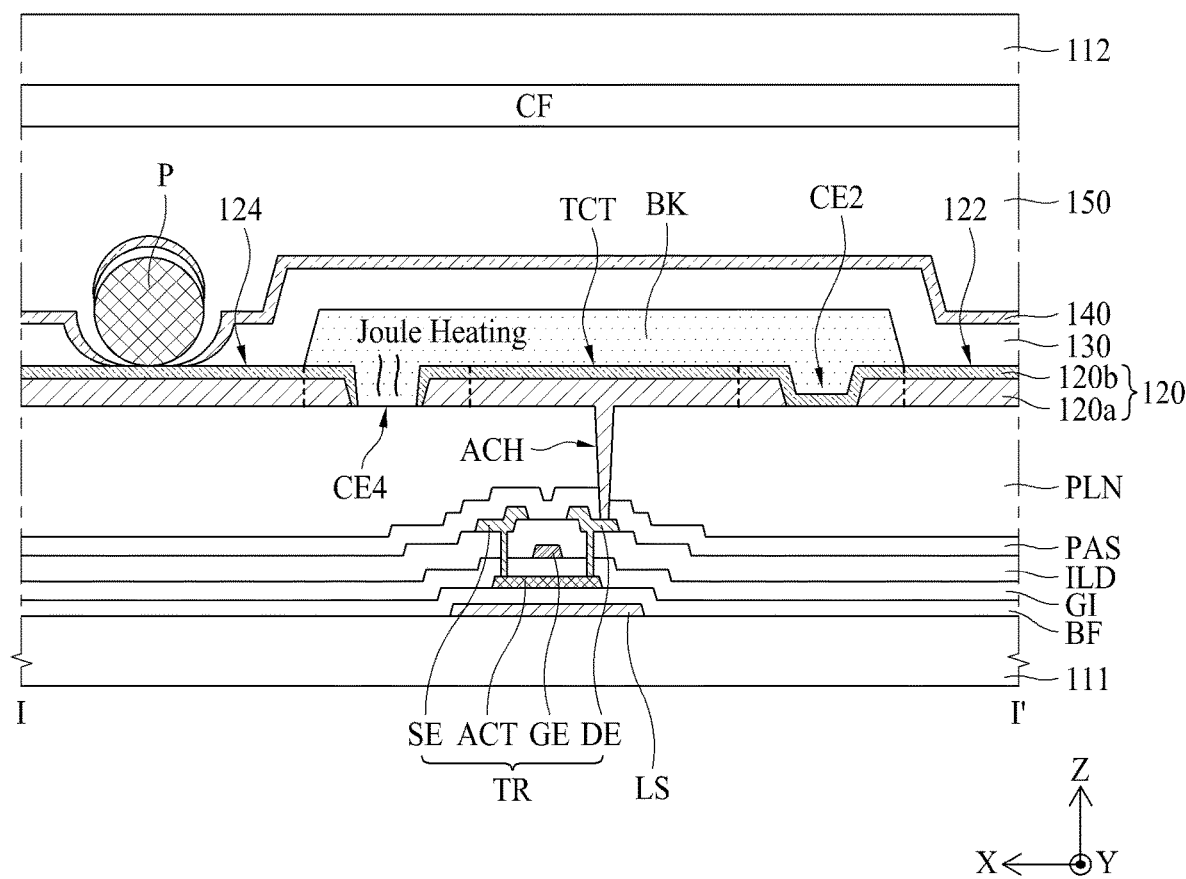
FIG. 7 is a view illustrating an example that particles occur in one of a plurality of divided electrodes in FIG. 6.

FIG. 2 is a schematic plane view illustrating a display panel according to one embodiment of the present disclosure, FIG. 3 is a view illustrating an example of a pixel provided in a display panel and FIG. 4 is a view illustrating an example of a first electrode provided in the pixel shown in FIG. 3. FIG. 5 is an enlarged view illustrating an area A of FIG. 4 and FIG. 6 is a cross-sectional view taken along line I-I' of FIG. 5. FIG. 7 is a view illustrating an example that particles occur in one of a plurality of divided electrodes in FIG. 6 and FIG. 8 is a view illustrating modified examples of a first electrode shown in FIG. 3.

In the following description, although the display panel 110 is embodied as a transparent display panel, the display panel 110 may be embodied as a general display panel in which a transmissive area TA is not provided.

Referring to FIG. 2 and FIG. 8, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 is connected to scan lines and supplies scan signals to the scan lines. The scan driver 205 may be disposed in one side of the display area DA of the display panel 110, or the non-display area NDA of both peripheral sides of the display panel 110 by a gate driver in panel (GIP) method. For example, as shown in FIG. 2, the scan driver 205 may be provided in both side of the display area DA of the display panel 110, but these scan drivers are not limited thereto. The scan driver 205 may be provided only in one side of the display area DA of the display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, about 90%, and the non-transmissive area NTA may be an area where light transmittance is smaller than (3%, for example, about 50%. At this time, α is greater than β. A user may view an object or background arranged over a rear surface of the display panel 110 due to the transmissive areas TA. For example, the display panel 110 may be between a viewer and the object or background. The viewer may see the object or background through the transmissive areas TA of the display panel 110.

The non-transmissive area NTA may include a plurality of pixels P, and a plurality of first and second signal lines SL1 and SL2 for supplying signals to the plurality of pixels P, respectively.

The plurality of first signal lines SL1 may be extended in a first direction (e.g., X-axis direction). The plurality of first signal lines SL1 may cross (e.g., overlap) the plurality of second signal lines SL2. Each of the plurality of first signal lines SL1 may include at least one scan line.

Hereinafter, when the first signal line SL1 includes a plurality of lines, the first signal line SL1 may refer to a signal line group including a plurality of lines. For example, one first signal line SL1 may refer to a signal line group including two scan lines.

The plurality of second signal lines SL2 may be extended in a second direction (e.g., Y-axis direction). Each of the plurality of second signal lines SL2 may include at least one of the data lines, a reference line, a pixel power line and a common power line.

Hereinafter, when the second signal line SL2 includes a plurality of lines, the second signal line SL2 may refer to a signal line group including a plurality of lines. For example, one second signal line SL2 may refer to a signal line group including two data lines, a reference line, a pixel power line and a common power line.

A transmissive area TA may be disposed between the first signal lines SL1 adjacent to each other. In addition, the transmissive area TA may be disposed between the second signal lines SL2 adjacent to each other. As a result, the transmissive area TA may be surrounded by two first signal lines SL1 and two second signal lines SL2.

Pixels P may be provided to overlap at least one of the first signal line SL1 and the second signal line SL2, thereby emitting predetermined light or selected light to display an image. An emission area may correspond to an area, from which light is emitted, in the pixel P.

Each of the pixels P may include at least one of a first subpixel SP1, a second subpixel SP2, a third subpixel SP3 and a fourth subpixel SP4. The first, second, third and fourth subpixels SP1, SP2, SP3, SP4 may be referred to collectively as the subpixels SP1, SP2, SP3, SP4 or the subpixels SP. The first subpixel SP1 may include a first emission area EA1 capable of emitting light of a red color. The second subpixel SP2 may include a second emission area EA2 capable of emitting light of a green color. The third subpixel SP3 may include a third emission area EA3 capable of emitting light of a blue color. The fourth subpixel SP4 may include a fourth emission area EA4 capable of emitting light of a white color. However, the emission areas are not limited to this example. Each of the pixels P may further include a subpixel capable of emitting light of a color other than red, green, blue and white. Also, the arrangement order of the subpixels SP1, SP2, SP3 and SP4 may be changed in various ways.

Hereinafter, for convenience of description, the description will be given based on that a first subpixel SP1 is a red subpixel capable of emitting red light, a second subpixel SP2 is a green subpixel capable of emitting green light, a third subpixel SP3 is a blue subpixel capable of emitting blue light, and a fourth subpixel SP4 is a white subpixel capable of emitting white light.

Each of the plurality of pixels P may be provided in the non-transmissive area NTA disposed between the transmissive areas TA. The plurality of pixels P may be disposed to be adjacent to each other in the non-transmissive area NTA in the second direction (e.g., Y-axis direction). For example, two of the plurality of pixels P may be disposed to be adjacent to each other in the non-transmissive area NTA with the first signal line SL1 interposed therebetween.

Each of the plurality of pixels P may include a first subpixel SP1, a second subpixel SP2 and a third subpixel SP3, and may further include a fourth subpixel SP4 in accordance with one embodiment. Each of the plurality of pixels P may include a first subpixel SP1, a second subpixel SP2, a third subpixel SP3 and a fourth subpixel SP4, which are disposed in a grid structure. For example, each of the plurality of pixels P may include a first subpixel SP1, a second subpixel SP2, a third subpixel SP3 and a fourth subpixel SP4, which are disposed around a middle area. In this case, the middle area may include a middle portion of each pixel P, and may indicate an area having a predetermined size or selected size.

In detail, the first and second subpixels SP1 and SP2 may be disposed to be adjacent to each other based on the center area of the pixel P in the first direction (e.g., X-axis direction), and the third and fourth subpixels SP3 and SP4 may be disposed to be adjacent to each other based on the center area of the pixel P in the first direction (e.g., X-axis direction). The first and second subpixels SP1 and SP2 may be disposed to be adjacent to the third and fourth subpixels SP3 and SP4, respectively, in the second direction (e.g., Y-axis direction).

Each of the first subpixel SP1, the second subpixel SP2, the third subpixel SP3 and the fourth subpixel SP4, which are disposed as described above, may include a circuit element including a capacitor, a thin film transistor and the like, a plurality of signal lines for supplying a signal to the circuit element, and a light emitting element. The thin film transistor may include a switching transistor, a sensing transistor and a driving transistor TR.

In the display panel 110, the plurality of signal lines as well as the first subpixel SP1, the second subpixel SP2, the third subpixel SP3 and the fourth subpixel SP4 may be disposed in the non-transmissive area NTA except the transmissive area TA. In one embodiment, the transmissive area TA is substantially free of the subpixels SP and the signal lines. Therefore, the first subpixel SP1, the second subpixel SP2, the third subpixel SP3 and the fourth subpixel SP4 may overlap at least one of the first signal line SL1 or the second signal line SL2.

Although the first subpixel SP1, the second subpixel SP2, the third subpixel SP3 and the fourth subpixel SP4 overlap at least a portion of the second signal line SL2 but do not overlap the first signal line SL1 as shown, the embodiment of the present disclosure is not limited thereto. In another embodiment, at least a portion of the first subpixel SP1, the second subpixel SP2, the third subpixel SP3 and the fourth subpixel SP4 may overlap the first signal line SL1.

The plurality of signal lines may include a first signal line SL1 extended in a first direction (e.g., X-axis direction) and a second signal line SL2 extended in a second direction (e.g., Y-axis direction) as described above.

The first signal line SL1 may include a scan line. The scan line may supply a scan signal to the subpixels SP1, SP2, SP3 and SP4 of the pixel P.

The second signal line SL2 may include at least one of at least a data line, a reference line, a pixel power line and a common power line.

The reference line may supply a reference voltage (or an initialization voltage or a sensing voltage) to the driving transistor TR of each of the subpixels SP1, SP2, SP3 and SP4 provided in the display area DA.

Each of the at least one data line may supply a data voltage to at least one of the subpixels SP1, SP2, SP3 and SP4 provided in the display area DA. For example, the first data line may supply a first data voltage to the driving transistor TR of each of the first and third subpixels SP1 and SP3, and the second data line may supply a second data voltage to the driving transistor TR of each of the second and fourth subpixels SP2 and SP4.

The pixel power line may supply a first power source to the first electrode 120 of each of the subpixels SP1, SP2, SP3 and SP4. The common power line may supply a second power source to the second electrodes 140 of each of the subpixels SP1, SP2, SP3 and SP4. Each of the first power source and the second power source may be or include an electrical voltage, an electrical current, or both.

The switching transistor is switched in accordance with the scan signal supplied to the scan line to supply the data voltage supplied from the data line to the driving transistor TR.

The sensing transistor serves to sense a deviation in a threshold voltage of the driving transistor TR, which causes deterioration of image quality.

The driving transistor TR is switched in accordance with the data voltage supplied from the switching thin film transistor to generate a data current from the first power source supplied from the pixel power line and supply the data current to the first electrode 120 of the subpixel. The driving transistor TR is provided for each of the subpixels SP1, SP2, SP3 and SP4, and includes an active layer ACT, a gate electrode GE, a source electrode SE and a drain electrode DE.

The capacitor serves to maintain the data voltage supplied to the driving transistor TR for one frame. The capacitor may include a first capacitor electrode and a second capacitor electrode but is not limited thereto. In another embodiment, the capacitor may include three capacitor electrodes.

In detail, and as illustrated in FIG. 6, an active layer ACT may be provided over a first substrate 111. The active layer ACT may be formed of a silicon-based semiconductor material or an oxide-based semiconductor material.

A light shielding layer LS for shielding external light incident on the active layer ACT may be provided between the active layer ACT and the first substrate 111. The light-shielding layer LS may be formed of a material having conductivity, and may be formed of a single layer or multi-layer made of one of molybdenum (Mo), aluminum (Al), chromium (Cr), gold (Au), titanium (Ti), nickel (Ni), neodymium (Nd) and copper (Cu), or their alloy. In this case, a buffer layer BF may be provided between the light shielding layer LS and the active layer ACT.

A gate insulating layer GI may be provided over the active layer ACT. The gate insulating layer GI may be formed of an inorganic film, for example, a silicon oxide film (SiOX), a silicon nitride film (SiNx), or a multi-film of SiOx and SiNx.

A gate electrode GE may be provided over the gate insulating layer GI. The gate electrode GE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic film, for example, a silicon oxide film (SiOX), a silicon nitride film (SiNx), or a multi-film of SiOx and SiNx.

The source electrode SE and the drain electrode DE may be provided over the interlayer dielectric layer ILD. The source electrode SE and the drain electrode DE may be connected to the active layer ACT through a contact hole that passes through the gate insulating layer GI and the interlayer dielectric layer ILD.

The source electrode SE and the drain electrode DE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

In addition, each of the plurality of signal lines, for example, the scan line, the data lines, reference line, pixel power line and common power line may be disposed on the same layer as any one of the light-shielding layer LS, the gate electrode GE, the source electrode SE and the drain electrode DE.

A passivation layer PAS for protecting the driving transistors TR may be provided over the source electrode SE and the drain electrode DE. A planarization layer PLN may be provided over the passivation layer PAS to planarize a step difference due to the driving transistor TR.

Light emitting elements comprised of a first electrode 120, a light emitting layer 130 and a second electrode 140, and a bank BK are provided over the planarization layer PLN.

The first electrode 120 may be provided for each of the subpixels SP1, SP2, SP3 and SP4. In detail, one first electrode 120 may be provided in the first subpixel SP1, another first electrode 120 may be provided in the second subpixel SP2, still another first electrode 120 may be provided in the third subpixel SP3, and further still another first electrode 120 may be provided in the fourth subpixel SP4. The first electrode 120 is not provided in the transmissive area TA.

The first electrode 120 included in each of the plurality of subpixels SP1, SP2, SP3 and SP4 may include a plurality of divided electrodes 121, 122, 123 and 124 (see FIG. 4), a transistor contact portion TCT, and a plurality of connection electrodes CE1, CE2, CE3 and CE4 (see FIG. 5).

The plurality of divided electrodes 121, 122, 123 and 124, the transistor contact portion TCT and the plurality of connection electrodes CE1, CE2, CE3 and CE4 may include a first electrode layer 120a, and a second electrode layer 120b disposed over the first electrode layer 120a, as shown in FIG. 6.

The first electrode layer 120a may be made of a first material. The first material may include a metal material having high reflectance. For example, the first material may be, but is not limited to, molybdenum (Mo), molybdenum-titanium (MoTi) alloy, or copper (Cu). The first material may be a material having higher reflectance and lower resistance than a second material that will be described later. Alternatively, the first material may be a material having a melting point higher than that of the second material. The first material may be or include a reflective material, and may be referred to as a "reflective material."

The second electrode layer 120b may be made of a second material. The second material may include a transparent material. For example, the second material may be indium-tin-oxide (ITO), but is not limited thereto. The second material may be a material having higher resistance than the first material. In one embodiment, the second material may be a material having a melting point higher than or equal to a predetermined temperature or selected temperature and lower than that of the first material. The first material may have higher reflectance than the second material, and the second material may have higher transparency than the first material.

Figure 8A:
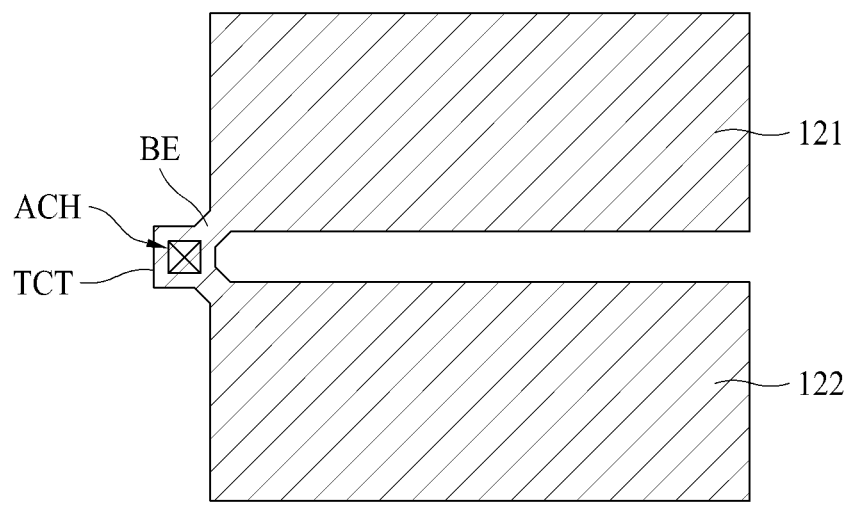
FIGS. 8A and 8B are views illustrating modified examples of a first electrode shown in FIG. 3.
Figure 8B:
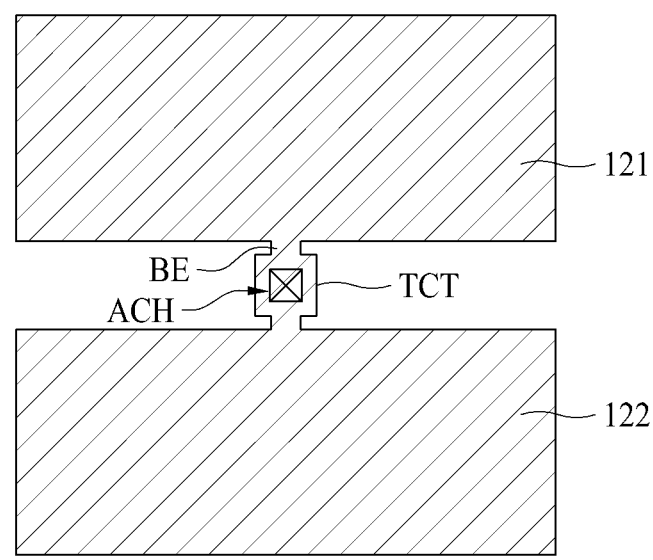

The plurality of divided electrodes 121, 122, 123 and 124 may include two or more of the divided electrodes, and may be disposed to be spaced apart from each other in the first direction (e.g., X-axis direction) or the second direction (e.g., Y-axis direction). For example, the first electrode 120 may include four divided electrodes 121, 122, 123 and 124 disposed based on the transistor contact portion TCT as shown in FIGS. 4 and 5, but is not limited thereto. The first electrode 120 may include two divided electrodes 121 and 122 as shown in FIGS. 8A and 8B. The first electrode 120 may be disposed such that two divided electrodes 121 and 122 are disposed based on the transistor contact portion TCT as shown in FIG. 8A, or the transistor contact portion TCT may be disposed outside the two divided electrodes 121 and 122 as shown in FIG. 8B.

As the number of divided electrodes included in the first electrode 120 is smaller, an aperture ratio may be increased, but a size of an area that becomes a dark spot due to particles is increased, whereby yield may be reduced. On the other hand, as the number of divided electrodes included in one first electrode 120 is increased, the aperture ratio may be reduced, but the size of the area that becomes a dark spot due to the particles may be reduced, whereby yield may be increased.

As shown in FIG. 4, when the number of divided electrodes included in one first electrode 120 is 4, the aperture ratio is reduced as compared with the first electrode 120 shown in FIGS. 8A and 8B, but the size of the area that becomes a dark spot due to particles may be reduced. As a result, yield may be improved. Meanwhile, as shown in FIGS. 8A and 8B, when the number of divided electrodes included in one first electrode 120 is 2, yield is reduced as compared with the first electrode 120 shown in FIG. 4, but the aperture ratio may be improved.

For convenience of description, the following description will be based on the configuration in which the divided electrode includes a first divided electrode 121, a second divided electrode 122, a third divided electrode 123 and a fourth divided electrode 124.

The transistor contact portion TCT may be disposed to be spaced apart from the first to fourth divided electrodes 121, 122, 123 and 124 between the first to fourth divided electrodes 121, 122, 123 and 124. The transistor contact portion TCT may be connected to the driving transistor TR through a contact hole ACH that passes through the planarization layer PLN and the passivation layer PAS.

In detail, the first electrode layer 120a of the transistor contact portion TCT may be disposed to be spaced from the first electrode layer 120a of the first to fourth divided electrodes 121, 122, 123 and 124 on the same layer. The first electrode layer 120a of the transistor contact portion TCT may be connected to the source electrode SE or the drain electrode of the driving transistor TR through the contact hole ACH as shown in FIG. 6.

The second electrode layer 120b of the transistor contact portion TCT may be provided on the same layer as the second electrode layer 120b of the first to fourth divided electrodes 121, 122, 123 and 124, and may be connected with the second electrode layer 120b of the first to fourth divided electrodes 121, 122, 123 and 124 through the connection electrode CE.

The transistor contact portion TCT may have a polygonal shape overlaying the contact hole ACH. For example, the transistor contact portion TCT may have a rectangular shape, but is not limited thereto. The transistor contact portion TCT may have various shapes such as a triangular shape and a hexagonal shape.

The transistor contact portion TCT includes a plurality of sides, and the connection electrodes CE may be connected to at least two of the plurality of sides. For example, the transistor contact portion TCT may have a rectangular shape, and may include four sides. Four connection electrodes CE may be connected to each of the four sides of the transistor contact portion TCT.

The connection electrode CE may connect each of the first to fourth divided electrodes 121, 122, 123 and 124 with the transistor contact portion TCT. The connection electrode CE may include a plurality of connection electrodes, and the plurality of connection electrodes CE may correspond to the first to fourth divided electrodes 121, 122, 123 and 124 in a one-to-one correspondence. That is, each of the first to fourth divided electrodes 121, 122, 123 and 124 may correspond to one connection electrode CE. In one embodiment, the number of connection electrodes CE is equal to the number of divided electrodes. For example, four connection electrodes CE1, CE2, CE3, CE4 correspond to four divided electrodes 121, 122, 123, 124.

In detail, as illustrated in FIG. 5, the first connection electrode CE1 may connect the first divided electrode 121 with the transistor contact portion TCT. At this time, the first connection electrode CE1 may be disposed between the first divided electrode 121 and the transistor contact portion TCT. One end of the first connection electrode CE1 may be connected with the first divided electrode 121 and the other end thereof may be connected with the transistor contact portion TCT. A connection electrode being "in connection with" a divided electrode includes configurations in which the connection electrode is in contact with the divided electrode. Being "in connection with" also includes configurations in which one or more layers (e.g., the first electrode layer 120a, the second electrode layer 120b, or both) is continuous across the divided electrode and the connection electrode. For example, as illustrated in FIG. 6, the second electrode layer 120b is a single, continuous layer that extends uninterrupted in the divided electrodes 122, 124, the connection electrodes CE2, CE4, and the transistor contact portion TCT. As such, the first electrode layer 120a, the second electrode layer 120b or both may be free of visible interfaces at boundaries between the divided electrodes and the connection electrodes, between the connection electrodes and the transistor contact portion TCT, or both. The above description of being "in connection with" is similarly applicable in the context of the connection electrodes CE1, CE3.

The first connection electrode CE1 may include a first electrode layer 120a and a second electrode layer 120b, but at least a portion thereof may include a high resistance area HRA having only one of the first electrode layer 120a and the second electrode layer 120*b*, as shown in FIG. 6. For example, at least a portion of the first connection electrode CE1 may include a high resistance area HRA having only the second electrode layer 120*b* of the first electrode layer 120*a* and the second electrode layer 120*b*.

The first electrode layer 120*a* of the first connection electrode CE1 may be connected with the first electrode layer 120*a* of the first divided electrode 121 at one end, and may be connected with the first electrode layer 120*a* of the transistor contact portion TCT at the other end. However, the first electrode layer 120*a* of the first connection electrode CE1 may be provided with an opening area OA between the first divided electrode 121 and the transistor contact portion TCT. Therefore, the first electrode layer 120*a* of the first connection electrode CE1 may not connect the first electrode layer 120*a* of the first divided electrode 121 with the first electrode layer 120*a* of the transistor contact portion TCT.

Meanwhile, the second electrode layer 120*b* of the first connection electrode CE1 may be protruded from the second electrode layer 120*b* of the first divided electrode 121 and extended to the second electrode layer 120*b* of the transistor contact portion TCT. Therefore, the second electrode layer 120*b* of the first connection electrode CE1 may connect the second electrode layer 120*b* of the first divided electrode 121 with the second electrode layer 120*b* of the transistor contact portion TCT. As shown in FIG. 6, the second electrode layer 120*b* may contact sidewalls of the first electrode layer 120*a* and may contact an upper surface of the planarization layer PLN.

As a result, the first divided electrode 121 may be connected with the transistor contact portion TCT through the second electrode layer 120*b* of the first connection electrode CE1.

In FIG. 4 and FIG. 5, the first connection electrode CE1 includes a first electrode layer 120*a* and a second electrode layer 120*b*, but is not limited thereto. In another embodiment, the first connection electrode CE1 may include only the second electrode layer 120*b*. In this case, the first connection electrode CE1 may be a high resistance area HRA.

The second connection electrode CE2 may connect the second divided electrode 122 with the transistor contact portion TCT. At this time, the second connection electrode CE2 may be disposed between the second divided electrode 122 and the transistor contact portion TCT. One end of the second connection electrode CE2 may be connected with the second divided electrode 122 and the other end thereof may be connected with the transistor contact portion TCT.

The second connection electrode CE2 may include a first electrode layer 120*a* and a second electrode layer 120*b*, but at least a portion thereof may include a high resistance area (HRA) having only one of the first electrode layer 120*a* and the second electrode layer 120*b*. For example, at least a portion of the second connection electrode CE2 may include a high resistance area HRA having only the second electrode layer 120*b* of the first electrode layer 120*a* and the second electrode layer 120*b*. The first electrode layer 120*a* of the second connection electrode CE2 may be connected with the first electrode layer 120*a* of the second divided electrode 122 at one end, and may be connected with the first electrode layer 120*a* of the transistor contact portion TCT at the other end. However, the first electrode layer 120*a* of the second connection electrode CE2 may be provided with an opening area OA between the second divided electrode 122 and the transistor contact portion TCT. Therefore, the first electrode layer 120*a* of the second connection electrode CE2 may not connect the first electrode layer 120*a* of the second divided electrode 122 with the first electrode layer 120*a* of the transistor contact portion TCT.

Meanwhile, the second electrode layer 120*b* of the second connection electrode CE2 may be protruded from the second electrode layer 120*b* of the second divided electrode 122 and extended to the second electrode layer 120*b* of the transistor contact portion TCT. Therefore, the second electrode layer 120*b* of the second connection electrode CE2 may connect the second electrode layer 120*b* of the second divided electrode 122 with the second electrode layer 120*b* of the transistor contact portion TCT.

As a result, the second divided electrode 122 may be connected with the transistor contact portion TCT through the second electrode layer 120*b* of the second connection electrode CE2.

FIG. 4 and FIG. 5 show that the second connection electrode CE2 includes the first electrode layer 120*a* and the second electrode layer 120*b*, but is not limited thereto. In another embodiment, the second connection electrode CE2 may include only the second electrode layer 120*b*. In this case, the second connection electrode CE2 may be a high resistance area HRA.

The third connection electrode CE3 may connect the third divided electrode 123 with the transistor contact portion TCT. At this time, the third connection electrode CE3 may be disposed between the third divided electrode 123 and the transistor contact portion TCT. One end of the third connection electrode CE3 may be connected with the third divided electrode 123, and the other end thereof may be connected with the transistor contact portion TCT.

The third connection electrode CE3 may include a first electrode layer 120*a* and a second electrode layer 120*b*, but at least a portion thereof may include a high resistance area HRA having only one of the first electrode layer 120*a* and the second electrode layer 120*b*. For example, at least a portion of the third connection electrode CE3 may include a high resistance area HRA having only the second electrode layer 120*b* of the first electrode layer 120*a* and the second electrode layer 120*b*. The first electrode layer 120*a* of the third connection electrode CE3 may be connected with the first electrode layer 120*a* of the third divided electrode 123 at one end, and may be connected with the first electrode layer 120*a* of the transistor contact portion TCT at the other end. However, the first electrode layer 120*a* of the third connection electrode CE3 may be provided with an opening area OA between the third divided electrode 123 and the transistor contact portion TCT. Therefore, the first electrode layer 120*a* of the third connection electrode CE3 may not connect the first electrode layer 120*a* of the third divided electrode 123 with the first electrode layer 120*a* of the transistor contact portion TCT.

Meanwhile, the second electrode layer 120*b* of the third connection electrode CE3 may be protruded from the second electrode layer 120*b* of the third divided electrode 123 and extended to the second electrode layer 120*b* of the transistor contact portion TCT. Therefore, the second electrode layer 120*b* of the third connection electrode CE3 may connect the second electrode layer 120*b* of the third divided electrode 123 with the second electrode layer 120*b* of the transistor contact portion TCT.

As a result, the third divided electrode 123 may be connected with the transistor contact portion TCT through the second electrode layer 120*b* of the third connection electrode CE3.

FIG. 4 and FIG. 5 show that the third connection electrode CE3 includes the first electrode layer 120*a* and the second electrode layer 120*b*, but is not limited thereto. In another embodiment, the third connection electrode CE3 may include only the second electrode layer 120b. In this case, the third connection electrode CE3 may be a high resistance area HRA.

The fourth connection electrode CE4 may connect the fourth divided electrode 124 with the transistor contact portion TCT. At this time, the fourth connection electrode CE4 may be disposed between the fourth divided electrode 124 and the transistor contact portion TCT. One end of the fourth connection electrode CE4 may be connected with the fourth divided electrode 124, and the other end thereof may be connected with the transistor contact portion TCT.

The fourth connection electrode CE4 may include a first electrode layer 120a and a second electrode layer 120b, but at least a portion thereof may include a high resistance area HRA having only one of the first electrode layer 120a and the second electrode layer 120b. For example, at least a portion of the fourth connection electrode CE4 may include a high resistance area HRA having only the second electrode layer 120b of the first electrode layer 120a and the second electrode layer 120b. The first electrode layer 120a of the fourth connection electrode CE4 may be connected with the first electrode layer 120a of the fourth divided electrode 124 at one end, and may be connected with the first electrode layer 120a of the transistor contact portion TCT at the other end. However, the first electrode layer 120a of the fourth connection electrode CE4 may be provided with an opening area OA between the fourth divided electrode 124 and the transistor contact portion TCT. Therefore, the first electrode layer 120a of the fourth connection electrode CE4 may not connect the first electrode layer 120a of the fourth divided electrode 124 with the first electrode layer 120a of the transistor contact portion TCT.

Meanwhile, the second electrode layer 120b of the fourth connection electrode CE4 may be protruded from the second electrode layer 120b of the fourth divided electrode 124 and extended to the second electrode layer 120b of the transistor contact portion TCT. Therefore, the second electrode layer 120b of the fourth connection electrode CE4 may connect the second electrode layer 120b of the fourth divided electrode 124 with the second electrode layer 120b of the transistor contact portion TCT.

As a result, the fourth divided electrode 124 may be connected with the transistor contact portion TCT through the second electrode layer 120b of the fourth connection electrode CE4.

FIG. 4 and FIG. 5 show that the fourth connection electrode CE4 includes the first electrode layer 120a and the second electrode layer 120b, but is not limited thereto. In another embodiment, the fourth connection electrode CE4 may include only the second electrode layer 120b. In this case, the fourth connection electrode CE4 may be a high resistance area HRA.

The display panel 110 according to one embodiment of the present disclosure is characterized in that a high resistance area HRA is provided in each of the connection electrodes CE1, CE2, CE3 and CE4.

A width of each of the connection electrodes CE1, CE2, CE3 and CE4, which are in contact with the divided electrodes 121, 122, 123 and 124, may be narrower than that of each of the divided electrodes 121, 122, 123 and 124. The connection electrodes CE1, CE2, CE3 and CE4 are formed to be thinner than the divided electrodes 121, 122, 123 and 124, whereby resistance of the connection electrodes CE1, CE2, CE3 and CE4 may be greater than that of the divided electrodes 121, 122, 123 and 124.

Also, the connection electrodes CE1, CE2, CE3 and CE4 may be formed such that a width W1 of the second electrode layer 120b is narrower than a width W2 of the first electrode layer 120a (see, for example, FIG. 5; widths W1, W2 may be measured along the X-axis direction for the connection electrode CE1). The connection electrodes CE1, CE2, CE3 and CE4 are formed such that the width W1 of the second electrode layer 120b is narrow, whereby resistance in the high resistance area HRA may be more increased. At this time, the width W1 of the second electrode layer 120b in the high resistance area HRA may be changed depending on resistance, thickness and length of a material constituting the second electrode layer 120b.

Meanwhile, in the present disclosure, it is not excluded that the connection electrodes CE1, CE2, CE3 and CE4 are formed to have the same width in the first electrode layer 120a and the second electrode layer 120b. The connection electrodes CE1, CE2, CE3 and CE4 may be formed such that the width W1 of the second electrode layer 120b is substantially the same as the width W2 of the first electrode layer 120a.

The connection electrodes CE1, CE2, CE3 and CE4 may be provided with one of the first electrode layer 120a and the second electrode layer 120b, for example, only the second electrode layer 120b, thereby including a high resistance area HRA that induces high resistance.

In the display panel 110 according to one embodiment of the present disclosure, as shown in FIG. 7, particles P may occur (e.g., be present) in any one of the plurality of divided electrodes 121, 122, 123 and 124. When particles P occur in any one of the divided electrodes 121, 122, 123 and 124, for example, the fourth divided electrode 124, the divided electrode 124 in which the particles P occur may generate a short with the second electrode 140. As a result, the organic light emitting layer 130 provided over the divided electrode 124 in which particles P occur does not emit light. For example, as shown in FIG. 7, a short may be generated under the particle P with the first electrode 120. The short may be between the particle P and the first electrode 120, or may be between the second electrode 140 and the first electrode 120, for example, when the particle P deforms the second electrode 140 without breaking through the second electrode 140. In one embodiment, both the particle P and the first electrode are shorted with the second electrode 140.

In the display panel 110 according to one embodiment of the present disclosure, the divided electrode 124 in which particles P occur is disconnected from the divided electrodes 121, 122 and 123 in which particles P do not occur, whereby the organic light emitting layer 130 provided over the divided electrodes 121, 122 and 123 in which particles P do not occur may emit light.

In the display panel 110 according to one embodiment of the present disclosure, a high resistance area HRA may be provided in the connection electrodes CE1, CE2, CE3 and CE4 so that the connection electrodes CE1, CE2, CE3 and CE4 may be disconnected by Joule heating.

When a short occurs between the divided electrode 124 in which particles P occur and the second electrode 140, a current may be concentrated on the divided electrode 124 in which a short occurs with the second electrode 140. Therefore, the current may also be concentrated on the connection electrode CE4 connected with the divided electrode 124 in which particles P occur.

Each of the connection electrodes CE1, CE2, CE3 and CE4 have a width narrower than that of each of the divided electrodes 121, 122, 123 and 124, and thus may have resistance higher than that of the divided electrodes 121, 122, 123 and 124. Therefore, the connection electrode CE4 connected with the divided electrode 124 in which particles P occur may generate heat higher than that of the divided electrode 124.

Furthermore, the connection electrodes CE1, CE2, CE3 and CE4 may include a high resistance area HRA provided with only the second electrode layer 120b, which is made of a second material and has a very narrow width W1, as described above.

When the current is concentrated on the connection electrode CE4 connected with the divided electrode 124 in which particles P occur, the connection electrode CE4 generates high heat due to high resistance and eventually reaches a temperature higher than the melting point of the second material. As a result, the connection electrode CE4 connected with the divided electrode 124 in which particles P occur may be melted and disconnected as shown in FIG. 7. In one embodiment, a portion of the second electrode layer 120b that is melted due to high heat is still present in the connection electrode CE4 (e.g., between a bank BK and the planarization layer PLN), but may have altered physical characteristics that are different from portions of the second electrode layer 120b that are unmelted. For example, the portion that is melted may have different crystalline properties than the portions that are unmelted. The altered physical characteristics may cause the melted portion of the second electrode layer 120b to present electrically as an open circuit (e.g., a very high resistance area). As such, the connection electrode CE4 having the melted portion may be electrically open.

When the connection electrode CE4 connected with the divided electrode 124 in which particles P occur is disconnected, the divided electrode 124 in which particles P occur may electrically be separated from the transistor contact portion TCT, and is not supplied with a signal from the driving transistor TR. As a result, the area where the divided electrode 124 with the particles P is formed becomes a dark spot.

However, the divided electrodes 121, 122 and 123 in which particles P do not occur may electrically be separated from the divided electrode 124 in which particles P occur, and may maintain a connection with the transistor contact portion TCT. Therefore, the divided electrodes 121, 122 and 123 in which particles do not occur may be supplied with a signal from the driving transistor TR through the transistor contact portion TCT.

As a result, in the display panel 110 according to one embodiment of the present disclosure, a dark spot occurs only in the area provided with the divided electrode 124 in which particles P occur, among the plurality of divided electrodes 121, 122, 123 and 124, and light may normally be emitted in the area provided with the divided electrodes 121, 122 and 123 in which particles P do not occur. The display panel 110 according to one embodiment of the present disclosure may reduce or minimize a size of a light emission area that becomes a dark spot when particles P occur.

A bank BK may be provided over the planarization layer PLN. In addition, the bank BK may be provided between the first electrodes 120 provided in each of the first to fourth subpixels SP1, SP2, SP3 and SP4. Further, the bank BK may be provided among the plurality of divided electrodes 121, 122, 123 and 124 provided in each of the first electrodes 120. At this time, the bank BK may be provided to cover or at least partially cover edges of each of the plurality of divided electrodes 121, 122, 123 and 124 and expose a portion of each of the plurality of divided electrodes 121, 122, 123 and 124. Therefore, the bank BK may prevent light emission efficiency from being deteriorated due to a current concentrated on ends of each of the plurality of divided electrodes 121, 122, 123 and 124.

Meanwhile, the bank BK may be provided over the transistor contact portion TCT and the plurality of connection electrodes CE1, CE2, CE3 and CE4 provided in each of the first electrodes 120. The plurality of connection electrodes CE1, CE2, CE3 and CE4 may be spaced apart from the organic light emitting layer 130 with the bank BK interposed therebetween. In the display panel 110 according to one embodiment of the present disclosure, since any one of the plurality of connection electrodes CE1, CE2, CE3 and CE4 is disconnected in the vicinity of the transistor contact portion TCT provided with the bank BK by Joule heating, the organic light emitting layer 130 and the second electrode 140 may be prevented from being damaged by Joule heating. The bank BK may be formed in substantially the same area including the light emission areas EA1, EA2, EA3 and EA4 of each of the subpixels SP1, SP2, SP3 and SP4. The light emission areas EA1, EA2, EA3 and E4 of each of the subpixels SP1, SP2, SP3 and SP4 indicate areas in which the first electrode 120, specifically the divided electrodes 121, 122, 123 and 124, the organic light emitting layer 130 and the second electrode 140 are sequentially deposited so that holes from the divided electrodes 121, 122, 123 and 124 and electrons from the second electrode 140 are combined with each other in the organic light emitting layer 130 to emit light. In this case, the area in which the bank BK is provided does not emit light, and thus becomes a non-light emission area, and the areas in which the bank BK is not provided and the divided electrodes 121, 122, 123 and 124 are exposed may be the light emission areas EA1, EA2, EA3 and EA4.

The bank BK may be formed of an organic film such as an acrylic resin, an epoxy resin, a phenolic resin, a polyamide resin and a polyimide resin.

The organic light emitting layer 130 may be provided over the first electrode 120. The organic light emitting layer 130 may include a hole transporting layer, a light emitting layer and an electron transporting layer. In this case, when a voltage is applied to the first electrode 120 and the second electrode 140, holes and electrons move to the light emitting layer through the hole transport layer and the electron transport layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, in the organic light emitting layer 130, a light emitting layer may be provided for each of the subpixels SP1, SP2, SP3 and SP4. For example, a red light emitting layer for emitting red light may be provided in the first subpixel SP1, a green light emitting layer for emitting green light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

The second electrode 140 may be provided over the organic light emitting layer 130 and the bank BK. The second electrode 140 may also be provided in the transmissive area TA as well as the non-transmissive area NTA that includes a light emission area EA, but is not limited thereto. The second electrode 140 may be provided only in the non-transmissive area NTA that includes the light emission areas EA1, EA2, EA3 and EA4, and may not be provided in the transmissive area TA to improve transmittance.

The second electrode 140 may be a common layer that is commonly provided in the subpixels SP1, SP2, SP3 and SP4 to apply the same voltage. The second electrode 140 may be formed of a conductive material capable of transmitting light. For example, the second electrode 140 may be formed of a low resistance metal material such as silver (Ag) or an alloy of magnesium (Mg) and silver (Ag). The second electrode 140 may be cathode electrode.

An encapsulation layer 150 may be provided over the light emitting elements. The encapsulation layer 150 may be provided over the second electrode 140 to overlay the second electrode 140. The encapsulation layer 150 serves to prevent oxygen or moisture from being permeated into the organic light emitting layer 130 and the second electrode 140. To this end, the encapsulation layer 150 may include at least one inorganic film and at least one organic film.

Although not shown in FIG. 6 and FIG. 7, a capping layer may further be provided between the second electrode 140 and the encapsulation layer 150.

A color filter CF may be provided over the encapsulation layer 150. The color filter CF may be provided over one surface of the second substrate 112 facing the first substrate 111. In this case, the first substrate 111 provided with the encapsulation layer 150 and the second substrate 112 provided with the color filter CF may be bonded to each other by a separate adhesive layer (not shown). The adhesive layer (not shown) may be an optically clear resin layer (OCR) or an optically clear adhesive film (OCA).

The color filter CF may be provided to be patterned for each of the subpixels SP1, SP2, SP3 and SP4. In detail, the color filter CF may include a first color filter, a second color filter and a third color filter. The first color filter may be disposed to correspond to the light emission area EA1 of the first subpixel SP1, and may be a red color filter that transmits red light. The second color filter may be disposed to correspond to the light emission area EA2 of the second subpixel SP2, and may be a green color filter that transmits green light. The third color filter may be disposed to correspond to the light emission area EA3 of the third subpixel SP3, and may be a blue color filter that transmits blue light. In one embodiment, the color filter CF may further include a fourth color filter. The fourth color filter may be disposed to correspond to the light emission area EA4 of the fourth subpixel SP4, and may be a white color filter that transmits white light. The white color filter may be formed of a transparent organic material that transmits white light.

A black matrix BM may be provided between the color filters CF and between the color filter CF and the transmissive area TA. The black matrix BM may be disposed between the subpixels SP1, SP2, SP3 and SP4 to prevent color mixture between adjacent subpixels SP1, SP2, SP3 and SP4 from occurring.

In addition, the black matrix BM may be disposed between the transmissive area TA and the plurality of subpixels SP1, SP2, SP3 and SP4 to prevent light emitted from each of the plurality of subpixels SP1, SP2, SP3 and SP4 from moving to the transmissive area TA.

The black matrix BM may include a material that absorbs light, for example, a black dye that absorbs substantially all of the light in the visible wavelength range.

In the display panel 110 according to one embodiment of the present disclosure, the plurality of divided electrodes 121, 122, 123 and 124 may be connected with the transistor contact portion TCT through the connection electrodes CE1, CE2, CE3 and CE4 that are disposed in one-to-one correspondence with the divided electrodes 121, 122, 123 and 124. In the display panel 110 according to one embodiment of the present disclosure, the high resistance area HRA may be provided in the connection electrodes CE1, CE2, CE3 and CE4 that are disposed in one-to-one correspondence with the plurality of divided electrodes 121, 122, 123 and 124. In the display panel 110 according to one embodiment of the present disclosure, when particles P occur in a portion of the plurality of divided electrodes 121, 122, 123 and 124 and a current is concentrated on the corresponding divided electrode, the high resistance area HRA of the connection electrodes CE1, CE2, CE3 and CE4 may be disconnected by Joule heating.

Therefore, in the display panel 110 according to one embodiment of the present disclosure, the area provided with the divided electrodes 124, in which particles P occur, among the plurality of divided electrodes 121, 122, 123 and 124 may become a dark spot, and light may normally be emitted in the area provided with the divided electrodes 121, 122 and 123 in which particles P do not occur. As a result, the display panel 110 according to one embodiment of the present disclosure may reduce or minimize the size of the light emission area that becomes a dark spot when particles P occur.

Also, in the display panel 110 according to one embodiment of the present disclosure, the plurality of connection electrodes CE1, CE2, CE3 and CE4 are spaced apart from the organic light emitting layer 130 with the bank BK interposed therebetween, whereby the organic light emitting layer 130 and the second electrode 140 may be prevented from being damaged when any one of the plurality of connection electrodes CE1, CE2, CE3 and CE4 is disconnected by Joule heating.

In addition, in the display panel 110 according to one embodiment of the present disclosure, the plurality of connection electrodes CE1, CE2, CE3 and CE4 may be disposed among the plurality of divided electrodes 121, 122, 123 and 124. In the display panel 110 according to one embodiment of the present disclosure, since the plurality of connection electrodes CE1, CE2, CE3 and CE4 are not protruded toward the transmissive area TA, the plurality of connection electrodes CE1, CE2, CE3 and CE4 may not affect light transmittance of the transmissive area TA.

In FIGS. 3 to 9, the connection electrodes CE1, CE2, CE3 and CE4 are disposed to be spaced apart from one another among the divided electrodes 121, 122, 123 and 124, but are not limited thereto. In another embodiment, the connection electrodes CE1, CE2, CE3 and CE4 may be connected to one another.

Also, in FIGS. 3 to 8, the connection electrodes CE1, CE2, CE3 and CE4 are connected with the divided electrodes 121, 122, 123 and 124 in one-to-one correspondence, but are not limited thereto. In another embodiment, the connection electrodes CE1, CE2, CE3 and CE4 may be disposed between the divided electrodes 121, 122, 123 and 124 and the transmissive area TA.

Hereinafter, another embodiment of the connection electrodes CE1, CE2, CE3 and CE4 will be described in detail with reference to FIGS. 9 to 12.

Figure 9:
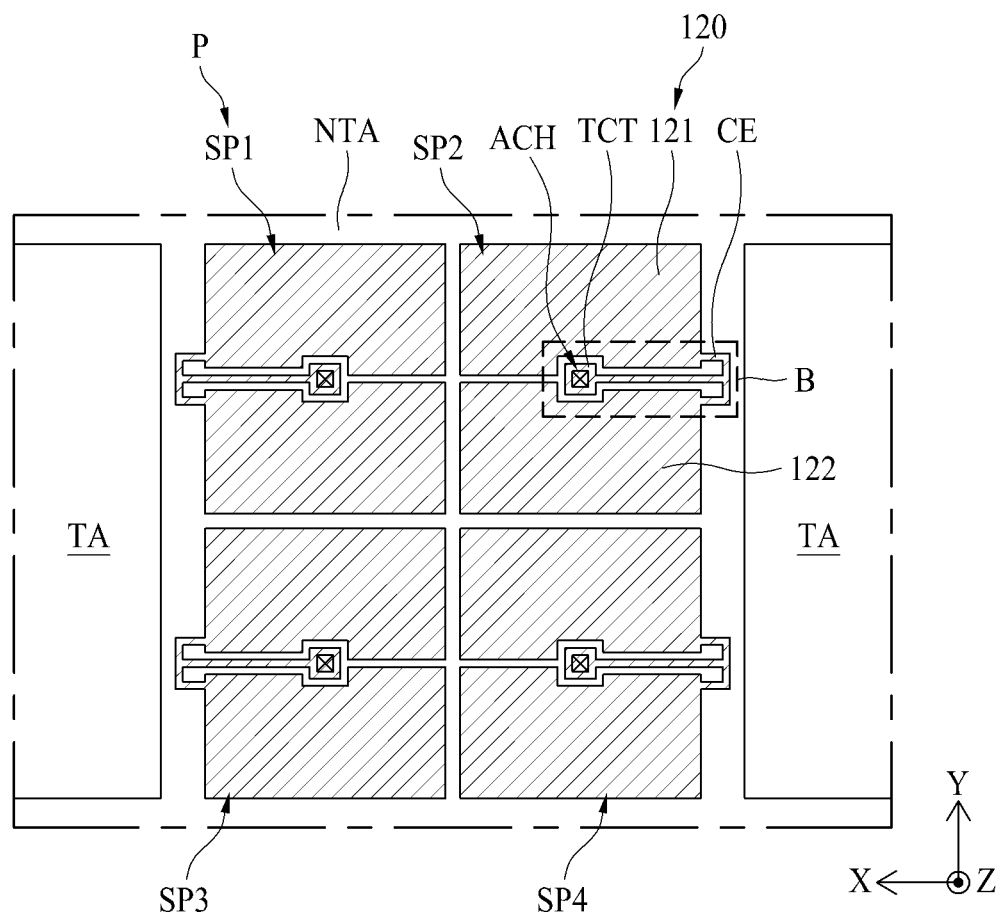
FIG. 9 is a view illustrating another example of a first electrode provided in the pixel shown in FIG. 3.
Figure 10:
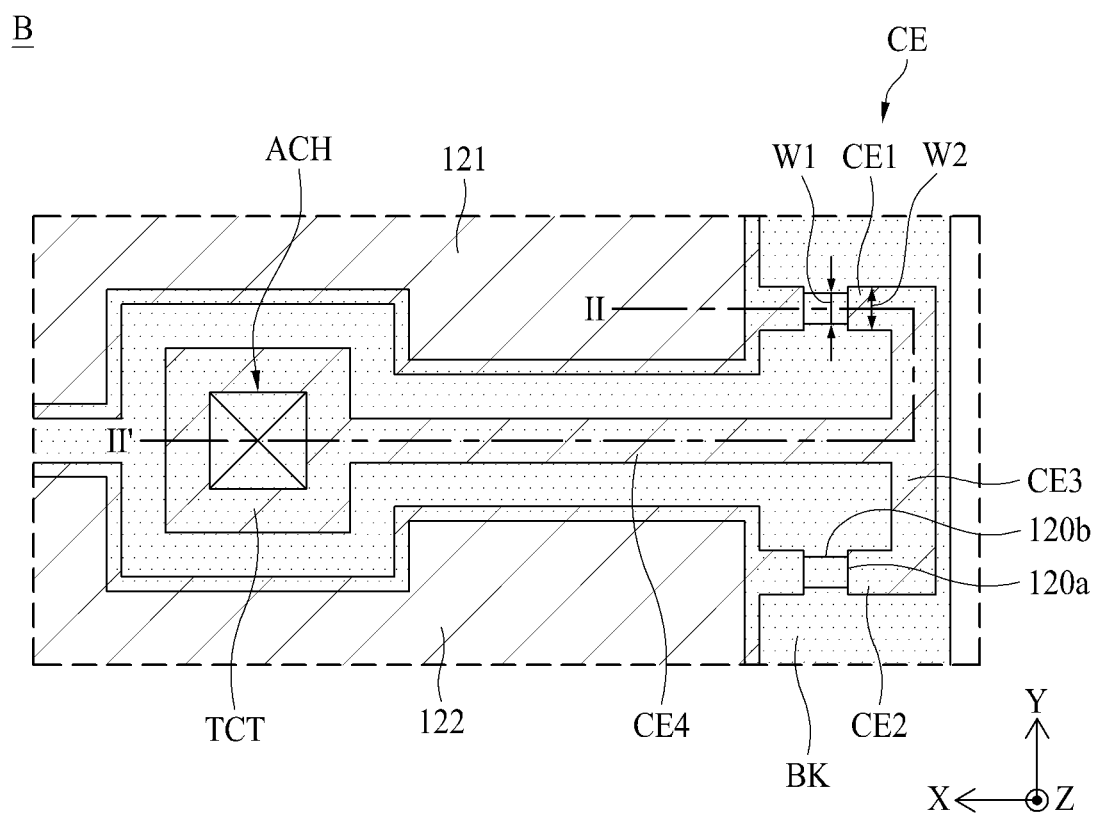
FIG. 10 is an enlarged view illustrating an area B of FIG. 9.
Figure 11:
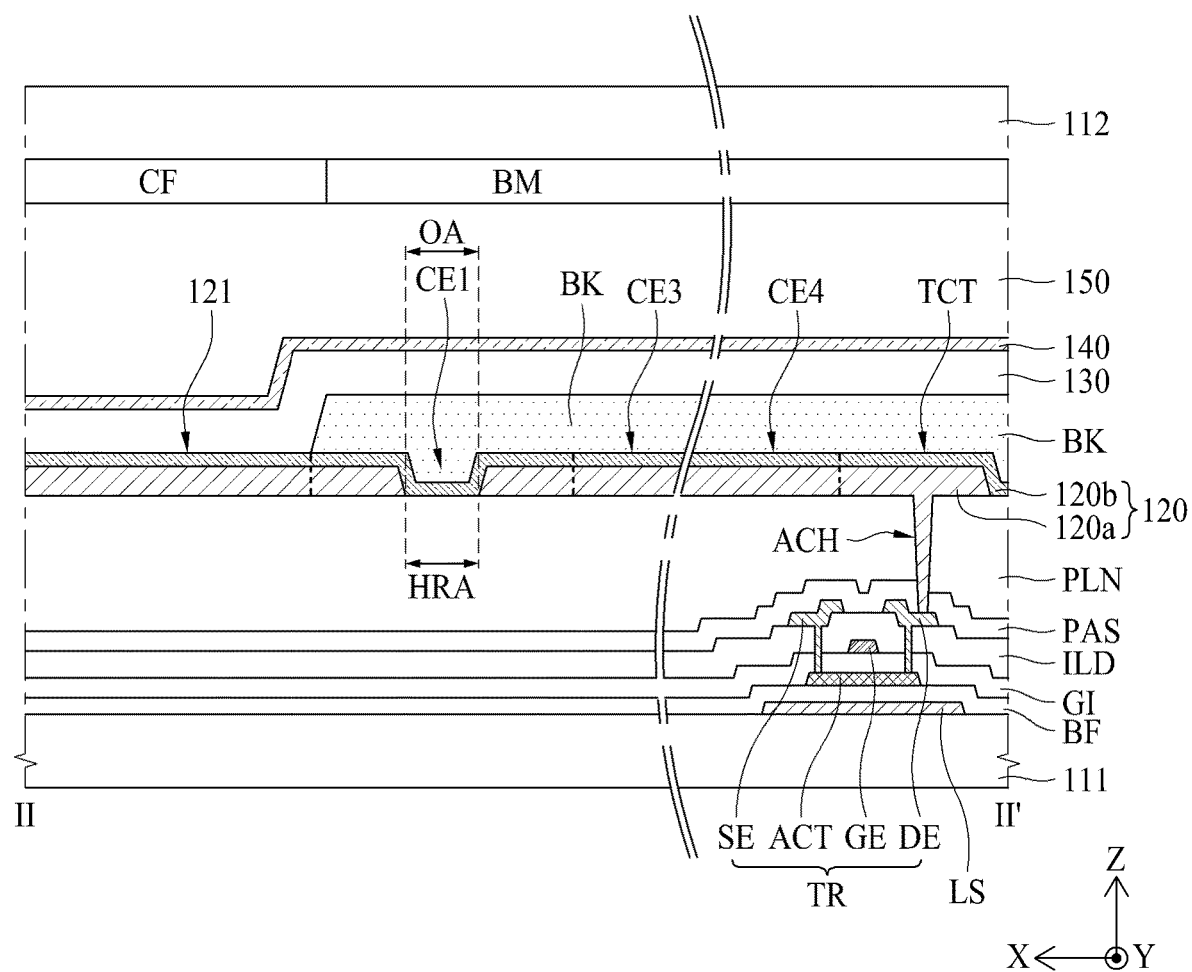
FIG. 11 is a cross-sectional view taken along line II-II' of FIG. 10.
Figure 12:
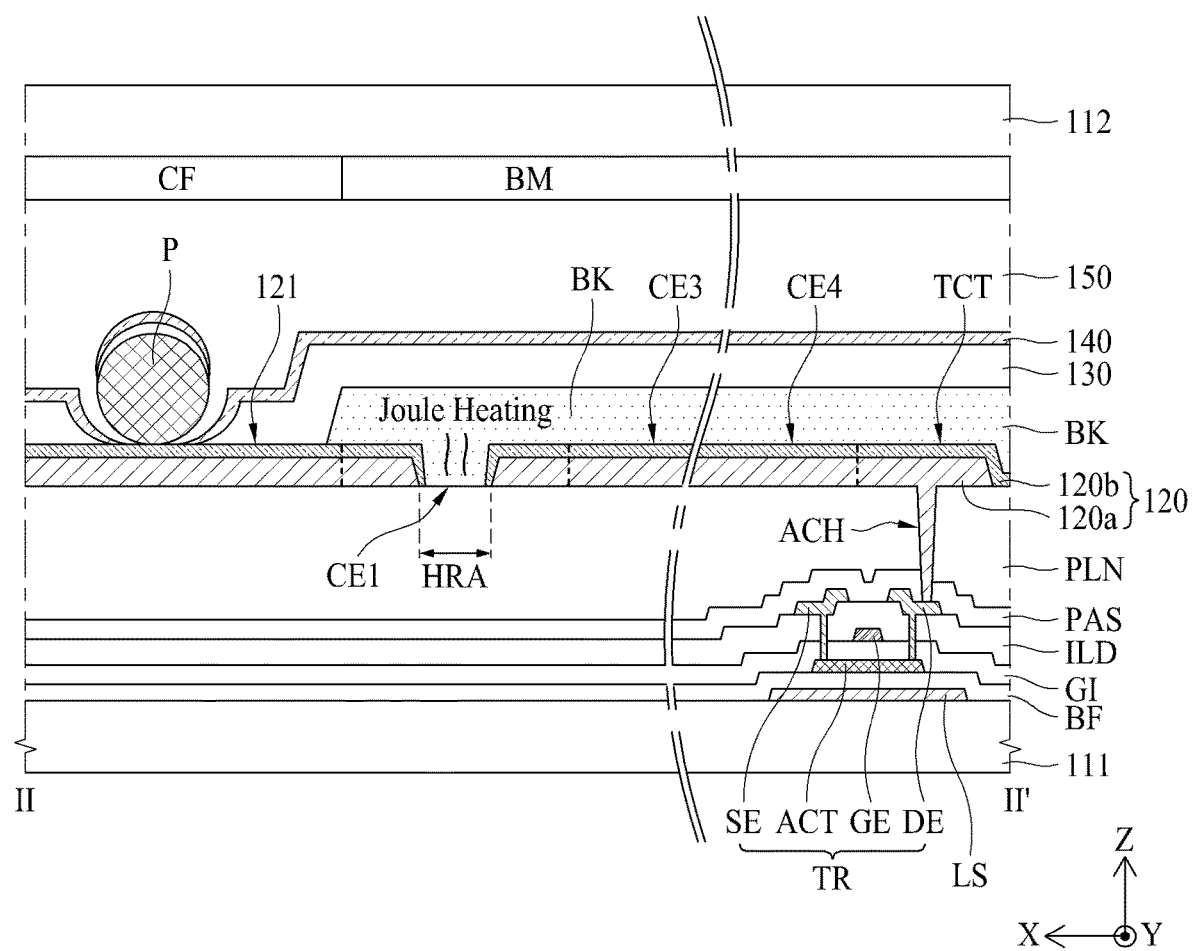
FIG. 12 is a view illustrating an example that particles occur in one of a plurality of divided electrodes in FIG. 11.

FIG. 9 is a view illustrating another example of a first electrode provided in the pixel shown in FIG. 3, FIG. 10 is an enlarged view illustrating an area B of FIG. 9, FIG. 11 is a cross-sectional view taken along line II-IF of FIG. 10, and FIG. 12 is a view illustrating an example that particles occur in one of a plurality of divided electrodes in FIG. 11.

The display panel 110 shown in FIGS. 9 to 12 is substantially the same as the display panel 110 shown in FIGS. 3 to 8 except for the first electrode 120. Hereinafter, the following description will be based on the first electrode 120, and a detailed description of other elements will be omitted.

Referring to FIGS. 9 to 12, the first electrode 120 may be provided for each of the subpixels SP1, SP2, SP3 and SP4 over the planarization layer PLN. In detail, one first electrode 120 may be provided in the first subpixel SP1, another first electrode 120 may be provided in the second subpixel SP2, still another first electrode 120 may be provided in the third subpixel SP3, and further sill another first electrode 120 may be provided in the fourth subpixel SP4. The first electrode 120 is not provided in the transmissive area TA.

The first electrode 120 provided in each of the plurality of subpixels SP1, SP2, SP3 and SP4 may include a plurality of divided electrodes 121, 122, a transistor contact portion TCT and a plurality of connection electrodes CE1, CE3, CE4.

The plurality of divided electrodes 121 and 122, the transistor contact portion TCT and the plurality of connection electrodes CE1, CE2, CE3 and CE4 may include a first electrode layer 120a and a second electrode layer 120b disposed over the first electrode layer 120a, as shown in FIG. 11.

The first electrode layer 120a may be made of a first material. The first material may include, but is not limited to, a metal material having high reflectance, for example, molybdenum (Mo), molybdenum-titanium (MoTi) alloy, or copper (Cu).

The second electrode layer 120b may be made of a second material. The second material may include, but is not limited to, a transparent material, for example, ITO. The second material may have resistance higher than that of the first material. Alternatively, the second material may have a melting point lower than that of the first material.

The plurality of divided electrodes 121 and 122 may include more than two divided electrodes, and may be disposed to be spaced apart from each other in the first direction (e.g., X-axis direction) or the second direction (e.g., Y-axis direction). For example, the first electrode 120 may include first and second divided electrodes 121 and 122 disposed based on the transistor contact portion TCT as shown in FIG. 9.

The transistor contact portion TCT may be disposed to be spaced apart from the first and second divided electrodes 121 and 122 between the first and second divided electrodes 121 and 122. The transistor contact portion TCT may be connected with the driving transistor TR through a contact hole ACH that passes through the planarization layer PLN and the passivation layer PAS.

In detail, the first electrode layer 120a of the transistor contact portion TCT may be disposed to be spaced from the first electrode layers 120a of the first and second divided electrodes 121 and 122 on the same layer. The first electrode layer 120a of the transistor contact portion TCT may be connected to a source electrode SE or a drain electrode DE of the driving transistor TR through the contact hole ACH as shown in FIG. 11.

The second electrode layer 120b of the transistor contact portion TCT may be formed on the same layer as the second electrode layers 120b of the first and second divided electrodes 121 and 122, and may be connected with the second electrode layers 120b of the first and second divided electrodes 121 and 122 through the connection electrode CE.

The transistor contact portion TCT may have a polygonal shape overlaying the contact hole ACH. For example, the transistor contact portion TCT may have a rectangular shape, but is not limited thereto. The transistor contact portion TCT may have various shapes such as a triangular shape and a hexagonal shape.

The transistor contact portion TCT includes a plurality of sides, and the connection electrode CE may be connected to at least one of the plurality of sides. For example, the transistor contact portion TCT may have a rectangular shape, and may include four sides. As shown in FIG. 10, one connection electrode CE4 may be connected to one of the four sides of the transistor contact portion TCT.

The connection electrode CE may connect the first and second divided electrodes 121 and 122 to the transistor contact portion TCT. The connection electrode CE may include a plurality of connection electrodes, and a portion of the plurality of connection electrodes CE may directly be connected with the first and second divided electrodes 121 and 122.

In detail, the plurality of connection electrodes CE may include first to fourth connection electrodes CE1, CE2, CE3 and CE4 to connect the first and second divided electrodes 121 and 122 to the transistor contact portion TCT.

The first connection electrode CE1 may be provided between the first divided electrode 121 and the transmissive area TA. One end of the first connection electrode CE1 may be connected to the first divided electrode 121 and extended toward the transmissive area TA as much as a predetermined length or selected length.

The first connection electrode CE1 may include a first electrode layer 120a and a second electrode layer 120b, but at least a portion thereof may include a high resistance area HRA having only one of the first electrode layer 120a or the second electrode layer 120b. For example, at least a portion of the first connection electrode CE1 may include a high resistance area HRA having only the second electrode layer 120b of the first electrode layer 120a and the second electrode layer 120b. The first electrode layer 120a of the first connection electrode CE1 may be connected with the first electrode layer 120a of the first divided electrode 121 at one end, and may be connected with the first electrode layer 120a of the third connection electrode CE3 at the other end. However, the first electrode layer 120a of the first connection electrode CE1 may be provided with an opening area OA between the first divided electrode 121 and the third connection electrode CE3. Therefore, the first electrode layer 120a of the first connection electrode CE1 may not connect the first electrode layer 120a of the first divided electrode 121 with the first electrode layer 120a of the third connection electrode CE3. The high resistance area HRA having only one of the first electrode layer 120a or the second electrode layer 120b may include configurations in which the first electrode layer 120a is discontinuous in the high resistance area HRA or in which the second electrode layer 120b is discontinuous in the high resistance area HRA. As an illustrative example, in FIG. 11, the first electrode layer 120a is discontinuous (e.g., not present) in the high resistance area HRA. The high resistance area HRA may be an area over which the first electrode layer 120a, the second electrode layer 120b or both is discontinuous. FIG. 12 illustrates an example in which the first electrode layer 120a and the second electrode layer 120b are discontinuous in the high resistance area HRA. As mentioned with reference to FIG. 6, the second electrode layer 120b may have a portion that is melted, and the melted portion, while present in the connection electrode CE, may present electrically as an open circuit.

Meanwhile, the second electrode layer 120b of the first connection electrode CE1 may be protruded from the second electrode layer 120b of the first divided electrode 121 and extended to the second electrode layer 120b of the third connection electrode CE3. Therefore, the second electrode layer 120b of the first connection electrode CE1 may connect the second electrode layer 120b of the first divided electrode 121 with the second electrode layer 120b of the third connection electrode CE3.

As a result, the first divided electrode 121 may be connected with the third connection electrode CE3 through the second electrode layer 120b of the first connection electrode CE1.

The second connection electrode CE2 may be provided between the second divided electrode 122 and the transmissive area TA. One end of the second connection electrode CE2 may be connected to the second divided electrode 122 and extended toward the transmissive area TA as much as a predetermined length or selected length.

The second connection electrode CE2 may include a first electrode layer 120a and a second electrode layer 120b, but at least a portion thereof may include a high resistance area HRA having only one of the first electrode layer 120a and the second electrode layer 120b. For example, at least a portion of the second connection electrode CE2 may include a high resistance area HRA having only the second electrode layer 120b of the first electrode layer 120a and the second electrode layer 120b. The first electrode layer 120a of the second connection electrode CE2 may be connected with the first electrode layer 120a of the second divided electrode 122 at one end, and may be connected with the first electrode layer 120a of the third connection electrode CE3 at the other end. However, the first electrode layer 120a of the second connection electrode CE2 may be provided with an opening area OA between the second divided electrode 122 and the third connection electrode CE3. Therefore, the first electrode layer 120a of the second connection electrode CE2 may not connect the first electrode layer 120a of the second divided electrode 122 with the first electrode layer 120a of the third connection electrode CE3.

Meanwhile, the second electrode layer 120b of the second connection electrode CE2 may be protruded from the second electrode layer 120b of the second divided electrode 122 and extended to the second electrode layer 120b of the third connection electrode CE3. Therefore, the second electrode layer 120b of the second connection electrode CE2 may connect the second electrode layer 120b of the second divided electrode 122 with the second electrode layer 120b of the third connection electrode CE3.

As a result, the second divided electrode 122 may be connected with the third connection electrode CE3 through the second electrode layer 120b of the second connection electrode CE2.

The third connection electrode CE3 may be provided between the first connection electrode CE1 and the second connection electrode CE2. One end of the third connection electrode CE3 may be connected to the first connection electrode CE1, and the other end thereof may be connected to the second connection electrode CE2.

The third connection electrode CE3 may include a first electrode layer 120a and a second electrode layer 120b. The first electrode layer 120a of the third connection electrode CE3 may be connected with the first electrode layer 120a of the first connection electrode CE1 at one end, and may be connected with the first electrode layer 120a of the second connection electrode CE2 at the other end. In addition, the second electrode layer 120b of the third connection electrode CE3 may be connected with the second electrode layer 120b of the first connection electrode CE1 at one end, and may be connected with the second electrode layer 120b of the second connection electrode CE2 at the other end.

The fourth connection electrode CE4 may be provided between the third connection electrode CE3 and the transistor contact portion TCT. One end of the fourth connection electrode CE4 may be connected to the third connection electrode CE3 and the other end may be connected to the transistor contact portion TCT.

The fourth connection electrode CE4 may include a first electrode layer 120a and a second electrode layer 120b. The first electrode layer 120a of the fourth connection electrode CE4 may be connected with the first electrode layer 120a of the third connection electrode CE3 at one end, and may be connected with the first electrode layer 120a of the transistor contact portion TCT at the other end. In addition, the second electrode layer 120b of the fourth connection electrode CE4 may be connected with the second electrode layer 120b of the third connection electrode CE3 at one end, and may be connected with the second electrode layer 120b of the transistor contact portion TCT at the other end.

As a result, the first divided electrode 121 may be connected with the transistor contact portion TCT through the first connection electrode CE1, the third connection electrode CE3 and the fourth connection electrode CE4. The second divided electrode 122 may be connected with the transistor contact portion TCT through the second connection electrode CE2, the third connection electrode CE3 and the fourth connection electrode CE4.

The display panel 110 according to another embodiment of the present disclosure is characterized in that the high resistance area HRA is provided in each of the first and second connection electrodes CE1 and CE2.

A width of each of the connection electrodes CE1, CE2, CE3 and CE4, which are in contact with the first and second divided electrodes 121 and 122, may be narrower than that of each of the first and second divided electrodes 121 and 122. The connection electrodes CE1, CE2, CE3 and CE4 are formed to be thinner than the first and second divided electrodes 121 and 122, whereby resistance of the connection electrodes CE1, CE2, CE3 and CE4 may be greater than that of the divided electrodes 121 and 122.

Also, the connection electrodes CE1, CE2, CE3 and CE4 may be formed such that a width W1 of the second electrode layer 120b is narrower than a width W2 of the first electrode layer 120a. As the width W1 of the second electrode layer 120b is formed to be thin, the first and second connection electrodes CE1 and CE2 may more increase resistance in the high resistance area HRA. However, in the present disclosure, it is not excluded that the connection electrodes CE1, CE2, CE3 and CE4 are formed to have the same width in the first electrode layer 120a and the second electrode layer 120b. The connection electrodes CE1, CE2, CE3 and CE4 may be formed such that the width W1 of the second electrode layer 120b is the same as the width W2 of the first electrode layer 120a.

The first and second connection electrodes CE1 and CE2 directly connected with the first and second divided electrodes 121 and 122 may be provided with one of the first electrode layer 120a and the second electrode layer 120b, for example, only the second electrode layer 120b, thereby including a high resistance area HRA that induces high resistance.

In the display panel 110 according to another embodiment of the present disclosure, as shown in FIG. 12, particles P may occur in any one of the plurality of divided electrodes 121 and 122. When particles P occur in any one of the divided electrodes 121 and 122, for example, the first divided electrode 121, the divided electrode 121 in which the particles P occur may generate a short with the second electrode 140. As a result, the organic light emitting layer 130 provided over the divided electrode 121 in which particles P occur does not emit light.

In the display panel 110 according to another embodiment of the present disclosure, the divided electrode 121 in which particles P occur is disconnected from the divided electrode 122 in which particles P do not occur, whereby the organic light emitting layer 130 provided over the divided electrode 122 in which particles P do not occur may emit light.

In the display panel 110 according to another embodiment of the present disclosure, a high resistance area HRA may be provided in the first and second connection electrodes CE1 and CE2 directly connected with the first and second divided electrodes 121 and 122 so that a portion of the connection electrodes CE1, CE2, CE3 and CE4 may be disconnected by Joule heating.

When a short occurs between the divided electrode 121 in which particles P occur and the second electrode 140, a current may be concentrated on the divided electrode 121 in which a short occurs with the second electrode 140. Therefore, the current may also be concentrated on the connection electrode CE1 connected with the divided electrode 121 in which particles P occur.

Each of the connection electrodes CE1, CE2, CE3 and CE4 have a width narrower than that of each of the divided electrodes 121, 122, 123 and 124, and thus may have resistance higher than that of the divided electrodes 121, 122, 123 and 124.

Therefore, the connection electrode CE1 connected with the divided electrode 121 in which particles P occur may generate heat higher than that of the divided electrode 121.

Furthermore, the connection electrodes CE1 and CE2 directly connected with the divided electrodes 121 and 122 may include a high resistance area HRA provided with only the second electrode layer 120b, which is made of a second material and has a very narrow width W1, as described above. When the current is concentrated on the connection electrode CE1 connected with the divided electrode 121 in which particles P occur, the connection electrode CE1 generates high heat due to high resistance and eventually reaches a temperature higher than the melting point of the second material. As a result, the connection electrode CE1 connected with the divided electrode 121 in which particles P occur may be melted and disconnected as shown in FIG. 12.

When the connection electrode CE1 connected with the divided electrode 121 in which particles P occur is disconnected, the divided electrode 121 in which particles P occur may electrically be separated from the transistor contact portion TCT, and cannot be supplied with a signal from the driving transistor TR. As a result, the area where the divided electrode 121 with the particles P is formed becomes a dark spot.

However, the divided electrode 122 in which particles P do not occur may electrically be separated from the divided electrode 121 in which particles P occur, and may maintain a connection with the transistor contact portion TCT. Therefore, the divided electrode 122 in which particles do not occur may be supplied with a signal from the driving transistor TR through the transistor contact portion TCT.

As a result, in the display panel 110 according to another embodiment of the present disclosure, a dark spot occurs only in the area provided with the divided electrode 121 in which particles P occur, among the plurality of divided electrodes 121 and 122, and light may normally be emitted in the area provided with the divided electrode 121 in which particles P occur. The display panel 110 according to another embodiment of the present disclosure may reduce or minimize a size of a light emission area that becomes a dark spot when particles P occur.

A bank BK may be provided over the planarization layer PLN. In addition, the bank BK may be provided between the first electrodes 120 provided in each of the first to fourth subpixels SP1, SP2, SP3 and SP4. Further, the bank BK may be provided between the plurality of divided electrodes 121 and 122 provided in each of the first electrodes 120. At this time, the bank BK may be provided to cover or at least partially cover edges of each of the plurality of divided electrodes 121 and 122 and expose a portion of each of the plurality of divided electrodes 121 and 122. Therefore, the bank BK may prevent light emission efficiency from being deteriorated due to a current concentrated on ends of each of the plurality of divided electrodes 121 and 122.

Meanwhile, the bank BK may also be provided between the first electrodes 120 and the transmissive area TA. Therefore, the bank BK may be provided over the transistor contact portion TCT and the plurality of connection electrodes CE1, CE2, CE3 and CE4 provided in each of the first electrodes 120. The plurality of connection electrodes CE1, CE2, CE3 and CE4 may be spaced apart from the organic light emitting layer 130 with the bank BK interposed therebetween. Therefore, the display panel 110 according to one embodiment of the present disclosure may prevent the organic light emitting layer 130 and the second electrode 140 from being damaged when any one of the plurality of connection electrodes CE1, CE2, CE3 and CE4 is disconnected by Joule heating.

According to the present disclosure, the following advantageous effects may be obtained.

In the present disclosure, the high resistance area is provided in the connection electrode for connecting the plurality of divided electrodes with the transistor contact portion, whereby the connection electrode connected with the corresponding divided electrode may be disconnected by Joule heating when particles occur in a portion of the plurality of divided electrodes. Therefore, the present disclosure may reduce or minimize the size of the light emission area that becomes a dark spot when the particles occur.

Also, in the present disclosure, the plurality of connection electrodes may be disposed in the vicinity of the transistor contact portion, and the bank may be provided over the plurality of connection electrodes and the transistor contact portion. Since any one of the plurality of connection electrodes is disconnected by Joule heating in the vicinity of the transistor contact portion provided with the bank, damage of the organic light emitting layer and the second electrode due to Joule heating may be reduced or minimized.

In addition, the plurality of connection electrodes are disposed between the plurality of divided electrodes without being protruded toward the transmissive area, whereby the present disclosure may be embodied without deterioration of light transmittance of the transmissive area.

It will be apparent to those skilled in the art that the present disclosure described above is not limited by the above-described embodiments and the accompanying drawings and that various substitutions, modifications and variations can be made in the present disclosure without departing from the spirit or scope of the disclosures.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate provided with a display area, the display area configured to display an image by a plurality of subpixels;
a plurality of first electrodes provided in each of the plurality of subpixels over the substrate, each first electrode of the plurality of first electrodes being one of an anode electrode or a cathode electrode;
a plurality of driving transistors provided between the substrate and the plurality of first electrodes, each of the plurality of driving transistors being coupled to a respective first electrode of the plurality of first electrodes;
a light emitting layer provided over the plurality of first electrodes;
a second electrode provided over the light emitting layer and over the plurality of first electrodes, the second electrode being another one of the anode electrode or the cathode electrode; and
a bank provided between the plurality of first electrodes and the second electrode,
wherein each of the plurality of first electrodes includes:
a plurality of divided electrodes spaced apart from each other;
a transistor contact portion coupled with the driving transistor through a contact hole; and
a plurality of connection electrodes connecting each of the plurality of divided electrodes with the transistor contact portion, and
wherein each of the plurality of first electrodes and the second electrode are spaced apart from each other and overlap with each other,
wherein the bank covers the plurality of connection electrodes.

2. The display device of claim 1, wherein the plurality of connection electrodes correspond to the plurality of divided electrodes in one-to-one correspondence.

3. The display device of claim 1, wherein each of the plurality of connection electrodes is disposed between the transistor contact portion and a corresponding divided electrode of the plurality of divided electrodes.

4. The display device of claim 1, wherein the transistor contact portion includes a plurality of sides, and the plurality of connection electrodes is connected to at least two of the plurality of sides.

5. The display device of claim 1, wherein the first electrode includes:
a first electrode layer made of a first material; and
a second electrode layer provided over the first electrode layer, the second electrode layer being made of a second material.

6. The display device of claim 5, wherein each of the plurality of divided electrodes includes a respective portion of first electrode layer and a respective portion of the second electrode layer.

7. The display device of claim 6, wherein each of the plurality of connection electrodes is:
protruded from the portion of the second electrode layer of a corresponding divided electrode of the plurality of divided electrodes, and
extended to the transistor contact portion.

8. The display device of claim 5, wherein the first material is a reflective material, and the second material is a transparent material.

9. The display device of claim 5, wherein the second material has resistance higher than that of the first material or has a melting point lower than that of the first material.

10. The display device of claim 1, wherein
the driving transistor includes an active layer, a gate electrode, a source electrode and a drain electrode,
the transistor contact portion includes a first electrode layer and a second electrode layer, and
the first electrode layer of the transistor contact portion is coupled to the source electrode or the drain electrode of the driving transistor through the contact hole.

11. The display device of claim 1, wherein a connection electrode of the plurality of connection electrodes is connected to a divided electrode of the divided electrodes, a particle being present in the divided electrode, the connection electrode being discontinuous.

12. The display device of claim 1, wherein the transistor contact portion is provided between the plurality of divided electrodes.

13. The display device of claim 1, wherein the plurality of connection electrodes are spaced apart from the light emitting layer with the bank interposed therebetween.

14. The display device of claim 1, wherein each of the plurality of divided electrodes overlaps at least a portion of a light emission area in which the light emitting layer emits light, and each of the plurality of connection electrodes overlaps a non-light emission area.

15. A display device comprising:
a substrate provided with transmissive areas and a non-transmissive area, the non-transmissive area being disposed between the transmissive areas;
a driving transistor provided in the non-transmissive area, the driving transistor being over the substrate;
a first electrode provided over the driving transistor, the first electrode including:
a plurality of divided electrodes; and
a plurality of connection electrodes configured to couple each of the plurality of divided electrodes to the driving transistor;
a light emitting layer provided over the first electrode;
a second electrode provided over the light emitting layer; and
a bank provided between the first electrode and the second electrode and, the bank covering the plurality of connection electrodes,
wherein the plurality of divided electrodes and the plurality of connection electrodes include:
a first electrode layer; and
a second electrode layer provided over the first electrode layer; and
wherein each of the first electrodes and the second electrode are spaced apart from each other and overlap with each other.

16. The display device of claim 15, wherein the first electrode layer includes a reflective material, and the second electrode layer includes a transparent material.

17. The display device of claim 15, wherein the second electrode layer is made of indium-tin-oxide.

18. The display device of claim 15, further comprising a high resistance area in which the plurality of connection electrodes are provided with only the second electrode layer.

19. The display device of claim 15, wherein the second electrode layer of the plurality of connection electrodes has a width narrower than that of the first electrode layer.

20. The display device of claim 15, wherein each of the plurality of divided electrodes corresponds to one of the plurality of connection electrodes.

21. The display device of claim 15, further comprising a transistor contact portion disposed between the plurality of divided electrodes and coupled with the driving transistor through a contact hole, wherein each of the plurality of connection electrodes couples each of the plurality of divided electrodes with the transistor contact portion.

22. The display device of claim 21, wherein each of the plurality of connection electrodes is provided between each of the plurality of divided electrodes and the transistor contact portion.

23. The display device of claim 21, wherein the bank is provided over the transistor contact portion,
wherein at least a portion of the plurality of connection electrodes includes a high resistance area in which the first electrode layer, the second electrode layer or both are discontinuous, and
wherein the high resistance area of each of the plurality of connection electrodes is disposed in the vicinity of the transistor contact portion provided with the bank.

24. The display device of claim 23, wherein the bank is provided on the high resistance area of each of the plurality of connection electrodes.

25. The display device of claim 15, wherein each of the plurality of connection electrodes is provided between the plurality of divided electrodes.

26. The display device of claim 15, wherein each of the plurality of connection electrodes is disposed between each of the plurality of divided electrodes and the transmissive area.

27. The display device of claim 15, wherein the plurality of connection electrodes are spaced apart from the light emitting layer with the bank interposed therebetween.

* * * * *